US012787427B2

(12) United States Patent
Jeong et al.

(10) Patent No.: US 12,787,427 B2
(45) Date of Patent: Nov. 3, 2026

(54) SEMICONDUCTOR DEVICES

(71) Applicant: Samsung Electronics Co., Ltd., Suwon-si (KR)

(72) Inventors: Hee Jeong, Hwaseong-si (KR); Noyoung Chung, Hwaseong-si (KR); Inseop Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 924 days.

(21) Appl. No.: 17/966,182

(22) Filed: Oct. 14, 2022

(65) Prior Publication Data

US 2023/0135975 A1 May 4, 2023

(30) Foreign Application Priority Data

Oct. 28, 2021 (KR) ........................ 10-2021-0145129

(51) Int. Cl.
*H10D 84/85* (2025.01)
*H10D 30/01* (2025.01)
(Continued)

(52) U.S. Cl.
CPC ........... *H10D 84/85* (2025.01); *H10D 30/014* (2025.01); *H10D 30/43* (2025.01);
(Continued)

(58) Field of Classification Search
CPC ......... H01L 21/02126; H01L 21/32137; H01L 21/02167; H01L 21/0217; H01L 21/26513; H01L 21/31111; H01L 21/3065; H01L 21/31116; H10D 64/01; H10D 84/834; H10D 64/021; H10D 64/017; H10D 84/0135; H10D 64/518; H10D 64/512;
(Continued)

(56) References Cited

U.S. PATENT DOCUMENTS 9,570,304 B2 2/2017 Park et al.
9,741,720 B1 8/2017 Siddiqui et al.
(Continued)

FOREIGN PATENT DOCUMENTS

CN 1437073 A 8/2003
JP 2008218962 A 9/2008
(Continued)

*Primary Examiner* — Jessica S Manno
*Assistant Examiner* — Victor Joseph Lasasso
(74) *Attorney, Agent, or Firm* — Muir Patent Law, PLLC

(57) ABSTRACT

A semiconductor device includes a substrate including an active region extending in a first direction, a gate structure extending in a second direction intersecting the active region on the substrate and including a gate dielectric layer and a gate electrode, channel layers spaced apart from each other in a third direction perpendicular to an upper surface of the substrate on the active region and surrounded by the gate structure, a lateral structure disposed on internal side surfaces of the gate dielectric layer and contacting the gate dielectric layer and the gate electrode, and source/drain regions disposed in regions in which the active region is recessed on opposite sides of the gate structure, and connected to the channel layers. A level of lower surfaces of the lateral structures is higher than a level of a lower surface of the gate electrode.

20 Claims, 41 Drawing Sheets

100

100

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 64/66*** | (2025.01) |
| ***H10D 84/01*** | (2026.01) |
| ***H10D 84/03*** | (2025.01) |
| ***H10P 14/20*** | (2026.01) |

(52) U.S. Cl.

CPC ..... *H10D 30/6729* (2025.01); *H10D 30/6735* (2025.01); *H10D 30/6739* (2025.01); *H10D 62/121* (2025.01); *H10D 62/151* (2025.01); *H10D 64/01326* (2026.01); *H10D 64/017* (2025.01); *H10D 64/671* (2025.01); *H10D 84/0167* (2025.01); *H10D 84/017* (2025.01); *H10D 84/0184* (2025.01); *H10D 84/0186* (2025.01); *H10D 84/038* (2025.01); *H10P 14/3462* (2026.01)

(58) Field of Classification Search

CPC .. H10D 62/151; H10D 30/6219; H10D 30/62; H10D 30/024; H10D 64/667; H10D 84/038; H10D 84/0158; H10D 30/6735; H10D 62/121; H10D 30/43; H10D 84/0149; H10D 84/0193; H10W 20/069

See application file for complete search history.

(56) References Cited

U.S. PATENT DOCUMENTS

| | | | | |
|---|---|---|---|---|
| 2005/0153538 | A1 | 7/2005 | Tsai et al. | |
| 2006/0134917 | A1 | 6/2006 | Huang et al. | |
| 2017/0110542 | A1* | 4/2017 | Lee ...................... | H10D 84/038 |
| 2017/0194443 | A1 | 7/2017 | Chen et al. | |
| 2017/0352744 | A1* | 12/2017 | Basker ................. | H10D 64/512 |
| 2020/0006080 | A1 | 1/2020 | Osawa et al. | |
| 2020/0058790 | A1 | 2/2020 | Chiang et al. | |
| 2021/0057525 | A1 | 2/2021 | Chiang et al. | |

FOREIGN PATENT DOCUMENTS

| | | | |
|---|---|---|---|
| KR | 1020070098320 | A | 10/2007 |
| KR | 100816719 | B1 | 3/2008 |
| KR | 1020170080437 | A | 7/2017 |
| KR | 1020190050607 | A | 5/2019 |
| KR | 1020210024405 | A | 3/2021 |
| KR | 1020210029642 | A | 3/2021 |
| KR | 1020210038762 | A | 4/2021 |

* cited by examiner

SEMICONDUCTOR DEVICES

CROSS TO REFERENCE TO RELATED APPLICATION(S)

This application claims benefit of priority to Korean Patent Application No. 10-2021-0145129 filed on Oct. 28, 2021 in the Korean Intellectual Property Office, the disclosure of which is incorporated by reference herein in its entirety.

BACKGROUND

Example embodiments of the present disclosure relate to a semiconductor device.

As demand for high performance, high speed, and/or multifunctionality in a semiconductor device has increased, integration density of a semiconductor device has increased. In manufacturing a semiconductor device having a fine pattern for high integration density of a semiconductor device, it has been necessary to implement patterns having a fine width or a fine spacing. Also, to overcome the limitations of operational properties due to the reduction of a size of a planar metal oxide semiconductor FET (MOSFET), there have been attempts to develop a semiconductor device including a fin-field-effect transistor (FinFET) having a three-dimensional channel structure.

SUMMARY

An example embodiment of the present disclosure is to provide a semiconductor device having improved electrical properties and reliability.

According to an example embodiment of the present disclosure, a semiconductor device includes a substrate having a first region in which a first active region is disposed and a second region in which a second active region is disposed, each of the first active region and the second active region extending in a first direction, a first gate structure disposed at the first region, the first gate structure extending in a second direction different from the first direction, intersecting the first active region, and including a first gate dielectric layer, a first electrode layer, and a second electrode layer stacked in order, a second gate structure disposed at the second region, the second gate structure extending in the second direction, intersecting the second active region, and including a second gate dielectric layer, a third electrode layer, and a fourth electrode layer stacked in order, a plurality of first channel layers being spaced apart from each other in a third direction perpendicular to an upper surface of the first active region, each of the plurality of first channel layers being surrounded by the first gate structure, a plurality of second channel layers being spaced apart from each other in the third direction on the second active region, each of the plurality of second channel layers being surrounded by the second gate structure, a pair of first source/drain regions disposed in first recessed regions adjacent to opposite sides of the first gate structure, and connected to the plurality of first channel layers, a pair of second source/drain regions disposed in second recessed regions adjacent to opposite sides of the second gate structure, and connected to the plurality of second channel layers, a pair of first gate spacer layers covering opposite side surfaces of the first gate structure, a pair of second gate spacer layers covering opposite side surfaces of the second gate structure, and a lateral structure disposed on each of internal side walls of the pair of second gate spacer layers. The lateral structure is interposed between the second gate dielectric layer and the third electrode layer. The third electrode layer extends horizontally to a region below the lateral structure and contacts a lower surface of the lateral structure.

According to an example embodiment of the present disclosure, a semiconductor device includes a substrate including an active region extending in a first direction, a gate structure extending in a second direction intersecting the active region on the substrate and including a gate dielectric layer and a gate electrode, a plurality of channel layers spaced apart from each other in a third direction perpendicular to an upper surface of the substrate on the active region, each channel layer of the plurality of channel layers being surrounded by the gate structure, a lateral structure disposed on an internal side surface of the gate dielectric layer and contacting the gate dielectric layer and the gate electrode, and a pair of source/drain regions on opposite sides of the gate structure, and connected to the plurality of channel layers. A level of lower surface of the lateral structure is higher than a level of a lower surface of the gate electrode.

According to an example embodiment of the present disclosure, a semiconductor device includes a substrate having a first region in which a first active region is disposed and a second region in which a second active region is disposed, each of the first active region and the second active region extending in a first direction, a first gate structure disposed at the first region, the first gate structure extending in a second direction, intersecting the first active region, and including a first gate dielectric layer and a first electrode layer, a second gate structure disposed at the second region, the second gate structure extending in the second direction, intersecting the second active region, and including a second gate dielectric layer and a second electrode layer, a plurality of first channel layers being spaced apart from each other in a third direction perpendicular to an upper surface of the first active region, each of the plurality of first channel layers being surrounded by the first gate structure, a plurality of second channel layers being spaced apart from each other in the third direction on the second active region, each of the plurality of second channel layers being surrounded by the second gate structure, a pair of first gate spacer layers covering opposite side surfaces of the first gate structure, a pair of second gate spacer layers covering opposite side surfaces of the second gate structure, and a lateral structure disposed in the second gate structure and including an insulating layer. The first electrode layer has a first length, and the second electrode layer has a second length smaller than the first length.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described with reference to the accompanying drawings.

Figure 1:
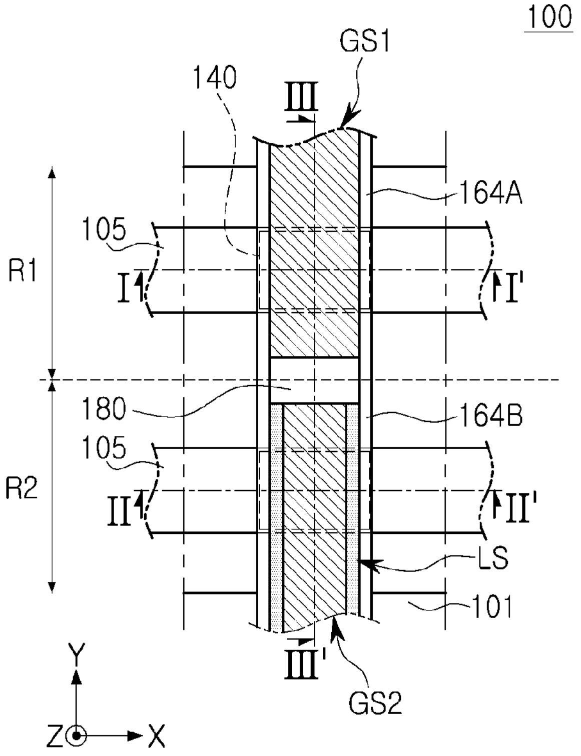
FIG. 1 is a layout view illustrating a semiconductor device according to an example embodiment of the present disclosure.

FIG. 1 is a layout view illustrating a semiconductor device according to an example embodiment. FIG. 1 illustrates only a portion of the components of the semiconductor device for ease of description.

Figure 2A:
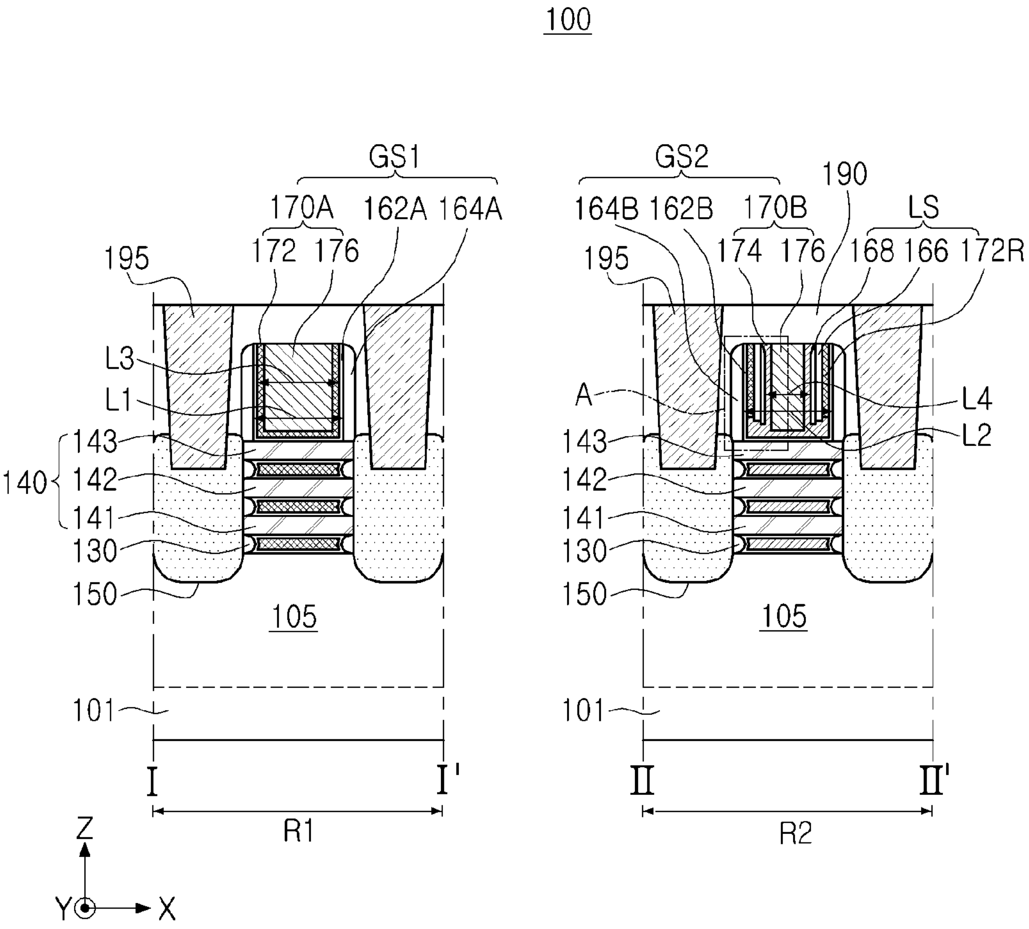
FIGS. 2A and 2B are cross-sectional views illustrating a semiconductor device according to an example embodiment of the present disclosure.
Figure 2B:
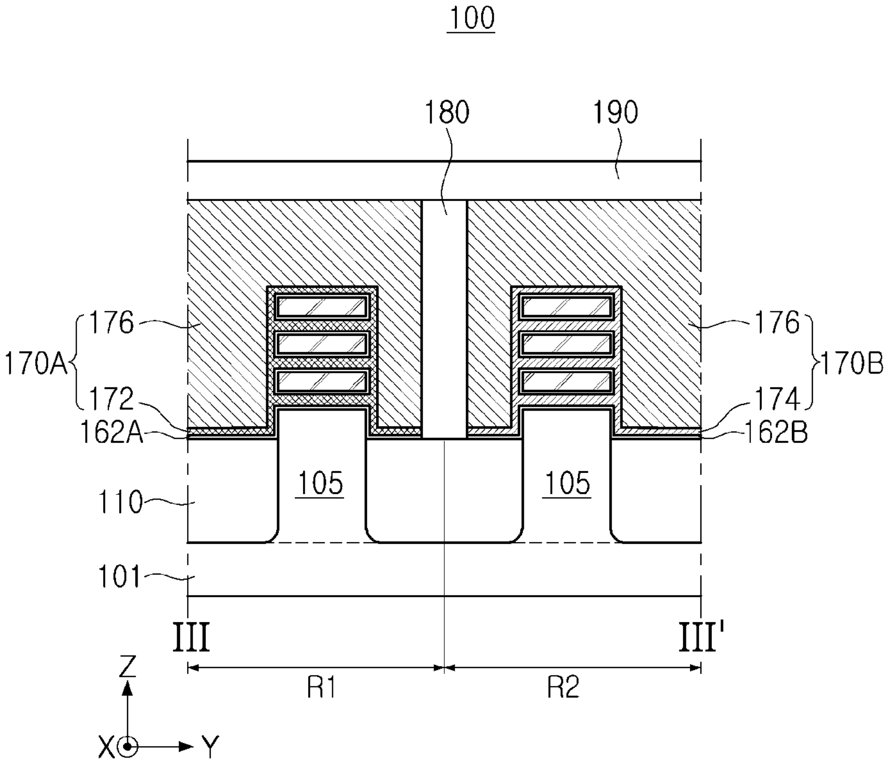

FIGS. 2A and 2B are cross-sectional views illustrating a semiconductor device according to an example embodiment. FIG. 2A is a cross-sectional view taken along lines I-I' and II-II' in FIG. 1, and FIG. 2B is a cross-sectional view taken along line III-III' in FIG. 1.

Figure 3:
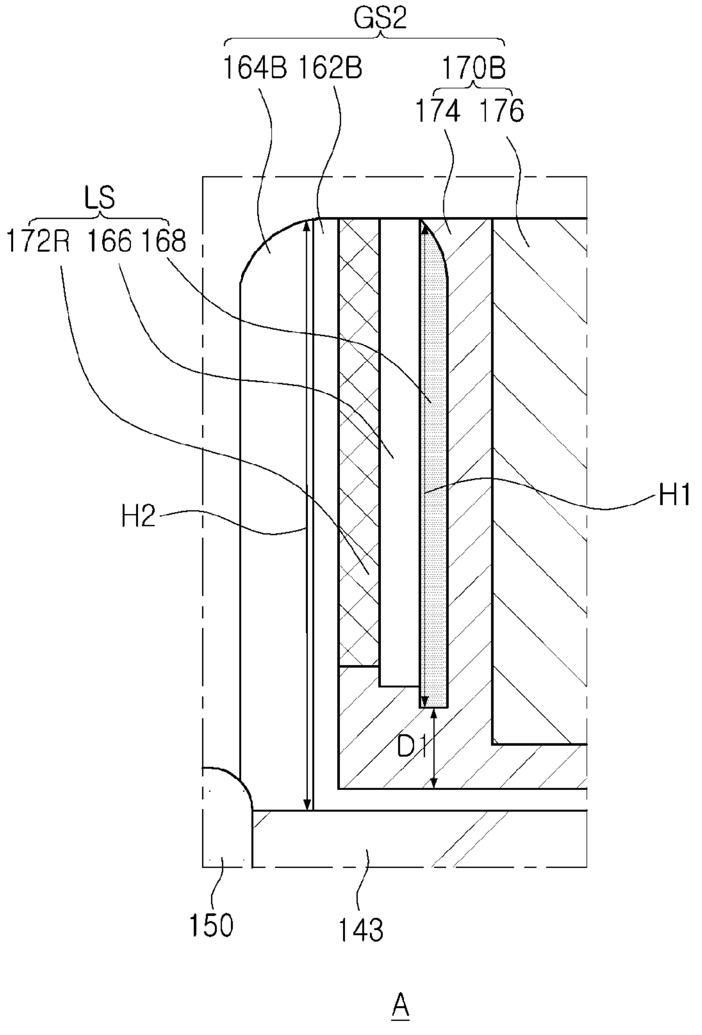
FIG. 3 is an enlarged view illustrating a portion of a semiconductor device according to an example embodiment of the present disclosure.

FIG. 3 is an enlarged view illustrating a portion of a semiconductor device according to an example embodiment, illustrating region "A" in FIG. 2B.

Referring to FIGS. 1 to 3, a semiconductor device 100 may include a substrate 101 having first and second regions R1 and R2 and including active regions 105, channel structures 140 including first to third channel layers 141, 142, and 143 spaced apart from each other vertically on the active regions 105, first and second gate structures GS1 and GS2 intersecting the active regions 105 and including first and second gate electrodes 170A and 170B, respectively, lateral structures LS disposed in the second gate structure GS2, source/drain regions 150 contacting the channel structures 140, and contact plugs 195 connected to the source/drain regions 150. The semiconductor device 100 may further include a device isolation layer 110, internal spacer layers 130, and an interlayer insulating layer 190. The first and second gate structures GS1 and GS2 may further include first and second gate dielectric layers 162A and 162B and first and second gate spacer layers 164A and 164B, respectively, in addition to the first and second gate electrodes 170A and 170B. In an embodiment, the first and second gate structures GS1 and GS2 may be formed using a cut metal gate process in which a gate isolation layer 180 (i.e., a gate cut isolation layer), which will be described later, cuts a metal gate into the first and second gate structures GS1 and GS2. For example, a dummy gate structure with a polysilicon gate may be formed, and then a metal gate replaces the dummy gate structure and the metal gate is cut to separate the metal gate into two or more portions for the first and second gate structures GS1 and GS2. The gate isolation layer 180 may fill the cut region between the first and second gate structures GS1 and GS2. For example, the first and second gate structure GS1 and GS2 may be formed using the metal gate cut process, and may be aligned or may extend along a straight line extending in the Y-direction.

In the semiconductor device 100, the active regions 105 may have a fin shape, and the first and second gate electrodes 170A and 170B may be disposed between the active regions 105 and the channel structures 140, between the first to third channel layers 141, 142, and 143 of the channel structures 140, and on the channel structures 140. Accordingly, the semiconductor device 100 may include a transistor having a multi-bridge channel FET (MBCFET™) structure, which is a gate-all-around field effect transistor. In an embodiment, the active regions 105 of a fin shape may be epitaxially grown from the substrate 101 or may be formed by etching the substrate 101.

The substrate 101 may have an upper surface extending in the X-direction and the Y-direction. The substrate 101 may include or may be formed of a semiconductor material, such as, for example, a group IV semiconductor, a group III-V compound semiconductor, and a group II-VI compound semiconductor. For example, the group IV semiconductor may include or may be silicon, germanium, or silicon-germanium. The substrate 101 may be provided as a bulk wafer, an epitaxial layer, a silicon on insulator (SOI) layer, a semiconductor on insulator (SeOI) layer, or the like.

The first and second regions R1 and R2 of the substrate 101 may be adjacent to each other in an extension direction of the first and second gate structures GS1 and GS2, such as, for example, the Y-direction.

The substrate 101 may include active regions 105 disposed in an upper portion thereof. The active regions 105 may be defined by the device isolation layer 110 in the substrate 101 and may be disposed to extend in the first direction, that is, for example, the X-direction. However, the active regions 105 may be described as a separate element from the substrate 101 in example embodiments. The active regions 105 may have a structure protruding upwardly. The active regions 105 may be formed as a portion of the substrate 101, or may include an epitaxial layer grown from the substrate 101. However, the active regions 105 may be partially recessed at regions adjacent to opposite sides of the first and second gate structures GS1 and GS2 such that recess regions may be formed, and the source/drain regions 150 may be disposed in the recess regions.

In example embodiments, the active regions 105 may include or may not include a well region including impurities. For example, for a p-type transistor (pFET), the well region may include or may be doped with n-type impurities such as phosphorus (P), arsenic (As), or antimony (Sb), and for an n-type transistor (nFET), the well region may include or may be doped with p-type impurities such as boron (B), gallium (Ga), or aluminum (Al). When the well region is included, the well region may be disposed at a predetermined depth from the upper surface of the active region 105. In an example embodiment, the active region 105 of the first region R1 may include or may be doped with n-type impurities, and the active region 105 of the second region R2 may include or may be doped with p-type impurities, but an example embodiment thereof is not limited thereto.

The device isolation layer 110 may define the active regions 105 in the substrate 101. The device isolation layer 110 may be formed by, for example, a shallow trench isolation (STI) process. In example embodiments, the device isolation layer 110 may further include a region having a step difference and extending further toward the substrate 101. The device isolation layer 110 may expose upper surfaces of the active regions 105, or may partially expose the upper surfaces of the active regions 105. In example embodiments, the device isolation layer 110 may have a curved upper surface to have a higher level towards the active regions 105. The device isolation layer 110 may be formed of an insulating material. The device isolation layer 110 may be formed of, for example, oxide, nitride, or a combination thereof.

The channel structures 140 may be disposed on the active regions 105 in regions in which the active regions 105 intersect the first and second gate structures GS1 and GS2. Each of the channel structures 140 may include first to third channel layers 141, 142, and 143, which may be two or more channel layers spaced apart from each other in the Z-direction. The channel structures 140 may be connected to the source/drain regions 150. The channel structures 140 may have a width equal to or narrower than a width of the active regions 105 in the Y-direction, and may have a width equal to or similar to widths of the first and second gate structures GS1 and GS2 in the X-direction. In example embodiments, the channel structures 140 may also have a reduced width such that side surfaces of the channel structures may be disposed below the first and second gate structures GS1 and GS2 in the X-direction.

The channel structures 140 may be formed of a semiconductor material, and may include or may be formed of, for example, at least one of silicon (Si), silicon germanium (SiGe), and germanium (Ge). The channel structures 140 may be formed of, for example, the same material as the substrate 101. In example embodiments, the channel structures 140 may include an impurity region disposed in a region adjacent to the source/drain regions 150. The number of the channel layers included in a single channel structure 140 and the shapes of the channel layers may be varied in the example embodiments. For example, in example embodiments, the channel structures 140 may further include a channel layer disposed below lowermost first and second gate electrodes 170A and 170B.

The source/drain regions 150 may be disposed in recess regions partially recessed into upper portions of the active regions 105 on opposite sides of the first and second gate structures GS1 and GS2. The source/drain regions 150 may be disposed to cover side surfaces of each of the first to third channel layers 141, 142, and 143 of the channel structures 140. The upper surfaces of the source/drain regions 150 may be disposed on a level the same as or similar to lower surfaces of uppermost portions of the first and second gate electrodes 170A and 170B, and the level may be varied in example embodiments. In example embodiments, the source/drain regions 150 may be connected or merged with each other on two or more active regions 105 adjacent to each other in the Y-direction on each of the first and second regions R1 and R2 such that the source/drain regions 150 may form a single source/drain region 150. The source/drain regions 150 may include impurities or may be doped with impurities. In an example embodiment, the source/drain regions 150 on opposite sides of the first gate electrode 170A may include p-type impurities or may be doped with p-type impurities, and the source/drain regions 150 on opposite sides of the second gate electrodes 170A may include or may be doped with n-type impurities, but an example embodiment thereof is not limited thereto.

The first and second gate structures GS1 and GS2 may intersect the active regions 105 and the channel structures 140 and may extend in the second direction, for example, the Y-direction. The first gate structure GS1 may be disposed in the first region R1, and the second gate structure GS2 may be disposed in the first region R2. The first and second gate structures GS1 and GS2 may be disposed linearly in the Y-direction. Channel regions of transistors may be formed in the channel structures 140 intersecting the first and second gate electrodes 170A and 170B of the first and second gate structures GS1 and GS2. In an embodiment, the first and second gate structures GS1 and GS2 may be arranged along a straight line extending in the Y-direction, and may be spaced apart from each other in the Y-direction with the gate isolation layer 180 therebetween.

The first gate structure GS1 may include a first gate electrode 170A, first gate dielectric layers 162A disposed between the first gate electrode 170A and the channel structure 140, and first gate spacer layers 164A disposed on side surfaces of the first gate electrode 170A. The second gate structure GS2 may include a second gate electrode 170B, second gate dielectric layers 162B disposed between the second gate electrode 170B and the channel structure 140, and second gate spacer layers 164B disposed on side surfaces of the second gate electrode 170B. In some example embodiments, the first and second gate structures GS1 and GS2 may further include a capping layer on an upper surface of each of the first and second gate electrodes 170A and 170B. In an embodiment, a portion of the interlayer insulating layer 190 on the first and second gate structures GS1 and GS2 may be referred to as a gate capping layer.

The first and second gate dielectric layers 162A and 162B may be disposed between the active regions 105 and the first and second gate electrodes 170A and 170B and between the channel structures 140 and the first and second gate electrodes 170A and 170B, and may be disposed to cover at least a portion of surfaces of the first and second gate electrodes 170A and 170B. For example, the first and second gate dielectric layers 162A and 162B may be disposed to surround entire surfaces of the first and second gate electrodes 170A and 170B other than upper surfaces thereof. The first and second gate dielectric layers 162A and 162B may extend to a region between the first and second gate electrodes 170A and 170B and the gate spacer layers 164, but an example embodiment thereof is not limited thereto. The first gate dielectric layer 162A may be in contact with the first electrode layer 172 on the channel structures 140, and the second gate dielectric layer 162B may be in contact with the second electrode layer 174 and a lateral conductive layer 172R. The first and second gate dielectric layers 162A and 162B may have the same thickness or different thicknesses.

The first and second gate dielectric layers 162A and 162B may be formed of the same material or may include different materials. The first and second gate dielectric layers 162A and 162B may include or may be formed of oxide, nitride, or a high-k material. The high-k material may refer to a dielectric material having a dielectric constant higher than that of a silicon oxide layer ($SiO_2$). The high dielectric constant material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In example embodiments, each of the first and second gate dielectric layers 162A and 162B may be formed of a multilayer film.

The first and second gate spacer layers 164A and 164B may be disposed on opposite side surfaces of the first and second gate electrodes 170A and 170B, respectively. The first and second gate spacer layers 164A and 164B may insulate the source/drain regions 150 from the first and second gate electrodes 170A and 170B. The first gate spacer layers 164A and the second gate spacer layers 164B may be in contact with and connected with each other on a boundary between the first region R1 and the second region R2. A first length L1 between the first gate spacer layers 164A in the X-direction may be substantially the same as a second length L2 between the second gate spacer layers 164B.

The first and second gate spacer layers 164A and 164B may be formed together in the same process, and may be formed of the same material. In example embodiments, each of the first and second gate spacer layers 164A and 164B may have a multilayer structure. The first and second gate spacer layers 164A and 164B may be formed of oxide, nitride, oxynitride, or a low-k dielectric film, for example.

The first and second gate electrodes 170A and 170B may fill a space between the channel structures 140 on the active regions 105 and may extend to a region above the channel structures 140. The first and second gate electrodes 170A and 170B may be spaced apart from the channel structures 140 by first and second gate dielectric layers 162A and 162B, respectively. The first gate electrode 170A may include first and third electrode layers 172 and 176 stacked in order from the first gate dielectric layers 162A. The second gate electrode 170B may include second and third electrode layers 174 and 176 stacked in order from the second gate dielectric layers 162B. The first and second gate electrodes 170A and 170B may include first and second electrode layers 172 and 174 different from each other, respectively, and both the first and second gate electrodes 170A and 170B may further include third electrode layers 176. The first and second gate electrodes 170A and 170B may be separated from each other by the gate isolation layer 180 on a boundary between the first region R1 and the second region R2.

In the second gate electrode 170B, the second electrode layer 174 may cover internal side surfaces and lower surfaces of the lateral structures LS, and may include a region extending horizontally to a region below the lateral structures LS. Accordingly, a fourth length L4 of the second gate electrode 170B in the X-direction may be smaller than a third length L3 of the first gate electrode 170A. The third length L3 and the fourth length L4 may refer to lengths at the same level other than an extended lower portion of the second electrode layer 174 or may refer to a minimum length. In some example embodiments, the second electrode layer 174 may include an air-gap therein below the lateral structures LS.

The first and second electrode layers 172 and 174 may have the same thickness or different thicknesses. In example embodiments, the relative thicknesses of the first to third electrode layers 172, 174, and 176 may be varied. The first to third electrode layers 172, 174, and 176 may include or may be formed of a conductive material, such as, for example, a metal nitride such as titanium nitride (TiN), tantalum nitride (TaN), and tungsten nitride (WN), metal such as aluminum (Al), tungsten (W), and molybdenum (Mo), or a semiconductor material such as doped polysilicon. The first to third electrode layers 172, 174, and 176 may include different materials. The first electrode layer 172 and the second electrode layer 174 may include materials having different work functions. For example, the first electrode layer 172 may include or may be formed of TiN, the second electrode layer 174 may include or may be formed of a metal compound having aluminum (Al) such as TiAlC and TiAlN, and the third electrode layer 176 may include or may be formed of tungsten (W) or molybdenum (Mo).

The lateral structures LS may be disposed in the second gate structure GS2 in the second region R2. The lateral structures LS may extend in the Y-direction along the second gate structure GS2, and may be in contact with the gate isolation layer 180 on one end as illustrated in FIG. 1. In the example embodiment, the lateral structures LS may not be disposed in the first region R1.

The lateral structures LS may be disposed on internal side surfaces of the second gate dielectric layer 162B, that is, internal side surfaces of the vertical portions, above the channel structure 140, and may be interposed between the second gate dielectric layer 162B and the second electrode layer 174. The vertical portions may be regions of the second gate dielectric layer 162B, and may refer to regions extending in the Z-direction on internal side surfaces of the second gate spacer layers 164B. The lateral structures LS may be disposed on internal side surfaces of the vertical portions and may be spaced apart from each other in the X-direction.

Lower surfaces of the lateral structures LS may be spaced apart from the channel structure 140 and horizontal portions of the second gate dielectric layer 162B upwardly. The horizontal portion may be a region of the second gate dielectric layer 162B and may refer to a region extending in the X-direction and the Y-direction on the upper surface of the third channel layer 143. The lower surfaces of the lateral structures LS may be covered with the second electrode layer 174 and may be in contact with the second electrode layer 174. External side surfaces of the lateral structures LS may be in contact with the second gate dielectric layer 162B, and internal side surfaces of the lateral structures LS may be in contact with the second electrode layer 174. A level of the lower surfaces of the lateral structures LS may be higher than a level of the lower surface of the second gate spacer layers 164B and may be higher than a level of the lower surface of the second electrode layer 174. A length H1 of the lateral structures LS in the Z-direction may be shorter than a length H2 of the second gate spacer layers 164B.

As illustrated in FIG. 3, each of the lateral structures LS may include a lateral conductive layer 172R, an etching protection layer 166, and a lateral protection layer 168 stacked in order on the vertical portion of the second gate dielectric layer 162B. In FIG. 3 and the other views, relative thicknesses of the lateral conductive layer 172R, the etching protection layer 166, the lateral protection layer 168, and the second electrode layer 174 are merely examples and may be varied in example embodiments. Levels of lower surfaces of the lateral conductive layer 172R, the etching protection layer 166, and the lateral protection layer 168 may be different. The level of the lower surface of the lateral protection layer 168 may be the lowest, the level of the lower surface of the etching protection layer 166 may be higher than the level of the lower surface of the lateral protection layer 168, and the level of the lower surface of the lateral conductive layer 172R may be the highest. For example, the lower surface of the lateral protection layer 168 may be spaced apart from the upper surface of the horizontal portion of the second gate dielectric layer 162B by a first dimension D1. The first dimension D1 may be equal to or similar to a sum of the thickness of the lateral conductive layer 172R and the thickness of the etching protection layer 166. However, in example embodiments, the relationship between the levels of the lower surfaces of the lateral conductive layer 172R, the etching protection layer 166, and the lateral protection layer 168 is not limited thereto. In some example embodiments, a profile of the lower surfaces of the lateral conductive layer 172R, the etching protection layer 166, and the lateral protection layer 168 may have various curved shapes depending on an etching process in which the lateral structure LS is formed.

The lateral conductive layer 172R may be a layer remaining after being formed together with the first electrode layer 172 of the first gate electrode 170A. Accordingly, the lateral conductive layer 172R may include or may be formed of the same material as that of the first electrode layer 172 and may include or may be formed of a conductive material.

The etching protection layer 166 may be used for patterning the first electrode layer 172 during the process of manufacturing the semiconductor device 100 described below with reference to FIGS. 14A and 14B. The etching protection layer 166 may include or may be formed of, for example, titanium (Ti). The etching protection layer 166 may include or may be formed of, for example, TiAlN or TiN, and may include a material different from a material of the first electrode layer 172. For example, the etching protection layer 166 may have etch selectivity with respect to the first electrode layer 172. The etching protection layer 166 may be a conductive layer, but an example embodiment thereof is not limited thereto, and the etching protection layer 166 may be an insulating layer in some example embodiments.

The lateral protection layer 168 may be used to strengthen a side surface of a mask layer during the process of manufacturing the semiconductor device 100 described below with reference to FIGS. 17A and 17. An upper end of the lateral protection layer 168 may have a shape with a decreasing width toward an external side surface, but an example embodiment thereof is not limited thereto. The lateral protection layer 168 may be an insulating layer, that is, for example, an inorganic insulating layer, and may be at least one of titanium oxide ($TiO_2$), aluminum oxide ($Al_2O_3$), silicon nitride (SiN), and silicon oxide ($SiO_2$), for example. The lateral protection layer 168 may include a material different from those of the second gate dielectric layer 162B and the second gate spacer layers 164B. The lateral protection layer 168 may include a material different from those of the etching protection layer 166 and the first electrode layer 172.

The internal spacer layers 130 may be disposed side by side with the first and second gate electrodes 170A and 170B between the channel structures 140. The first and second gate electrodes 170A and 170B may be stably spaced apart from the source/drain regions 150 by the internal spacer layers 130 and may be electrically isolated from each other. Side surfaces of the internal spacer layers 130 opposing the first and second gate electrodes 170A and 170B may have a rounded shape, rounded inwardly toward the first and second gate electrodes 170A and 170B, but an example embodiment thereof is not limited thereto. The internal spacer layers 130 may be formed of oxide, nitride, or oxynitride, and may be formed of a low-k dielectric film. However, in some example embodiments, the internal spacer layers 130 may not be provided.

The gate isolation layer 180 may be disposed to separate the first and second gate electrodes 170A and 170B from each other and to separate the first and second gate dielectric layers 162A and 162B from each other. A lower surface of the gate isolation layer 180 may be in contact with the device isolation layer 110. The side surfaces of the gate isolation layer 180 may be perpendicular to the upper surface of the substrate 101 or may be inclined such that a width thereof may decrease downwardly. As illustrated in FIG. 1, the gate isolation layer 180 may be disposed between a pair of first and second gate spacer layers 164A and 164B. However, in example embodiments, the gate isolation layer 180 may penetrate the first and second gate spacer layers 164A and 164B and may extend in the X-direction.

The gate isolation layer 180 may include or may be formed of an insulating material. The gate isolation layer 180 may include or may be formed of, for example, at least one of silicon oxide, silicon nitride, silicon oxynitride, and silicon carbide. The gate isolation layer 180 may be formed as a single insulating layer or may have a structure in which a plurality of insulating layers are stacked.

The interlayer insulating layer 190 may be disposed to cover the source/drain regions 150 and the first and second gate structures GS1 and GS2 and to cover the device isolation layer 110. The interlayer insulating layer 190 may include or may be formed of at least one of an oxide, a nitride, and an oxynitride, and may include or may be formed of, for example, a low-k dielectric material. In example embodiments, the interlayer insulating layer 190 may include a plurality of insulating layers.

The contact plugs 195 may penetrate the interlayer insulating layer 190 and may be connected to the source/drain regions 150, and may apply an electrical signal to the source/drain regions 150. The contact plugs 195 may have included side surfaces of which a width of a lower portion thereof may be narrower than a width of an upper portion depending on an aspect ratio, but an example embodiment thereof is not limited thereto. The contact plugs 195 may extend from an upper portion to, for example, a lower surface of the third channel layer 143 or below the lower surface of the third channel layer 143, but an example embodiment thereof is not limited thereto. In some example embodiments, the contact plugs 195 may be disposed to be in contact with upper surfaces of the source/drain regions 150 along the upper surfaces without being recessed into the source/drain regions 150.

The contact plugs 195 may include a metal silicide layer disposed on a lower end including a lower surface, and may further include a barrier layer disposed on an upper surface and sidewalls of the metal silicide layer. The barrier layer may include or may be formed of, for example, a metal nitride such as titanium nitride (TiN), tantalum nitride (TaN), and tungsten nitride (WN). The contact plugs 195 may include or may be formed of, for example, metal such as aluminum (Al), tungsten (W), and molybdenum (Mo). In example embodiments, the number of the conductive layers included in the contact plugs 195 and the arrangement form of the conductive layers may be varied.

Figure 4A:
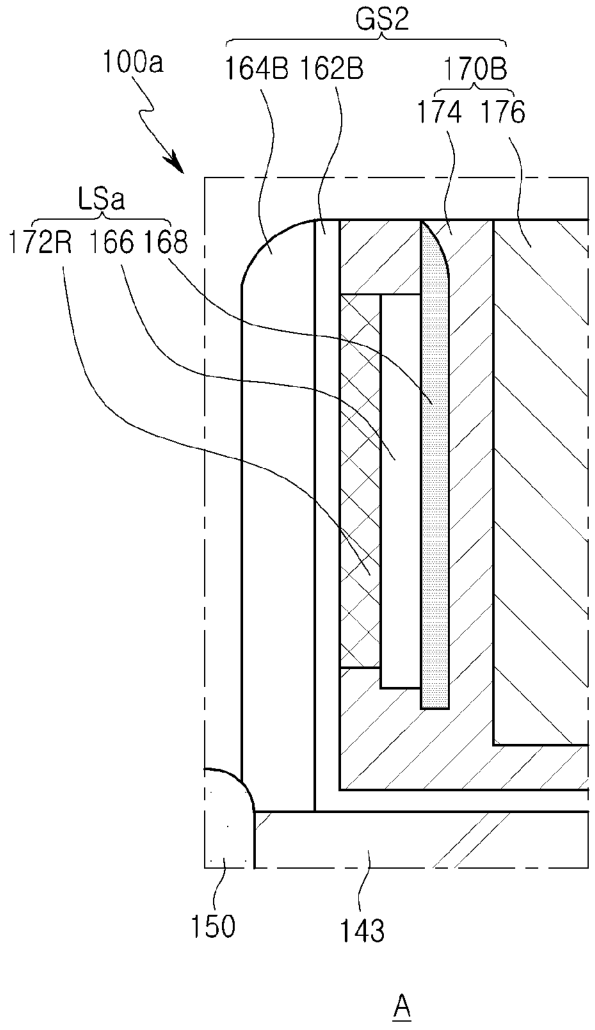
FIGS. 4A and 4B are enlarged views illustrating a portion of a semiconductor device according to an example embodiment of the present disclosure.
Figure 4B:
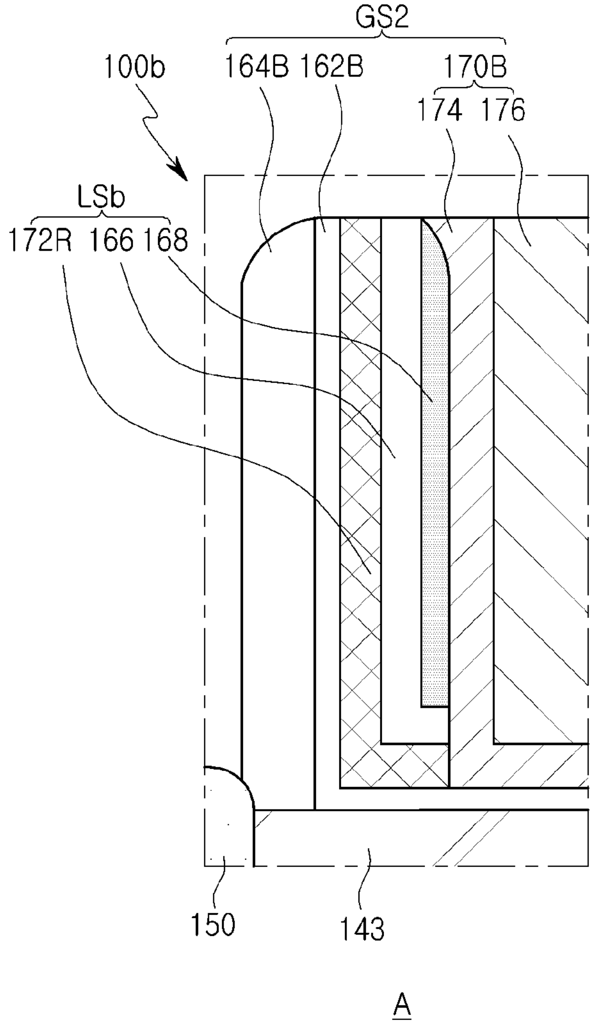

FIGS. 4A and 4B are enlarged views illustrating a portion of a semiconductor device according to an example embodiment Referring to FIG. 4A, in the semiconductor device 100*a*, the shapes of the lateral structures LSa and the second electrode layer 174 may be different from the example embodiment in FIGS. 2A and 3. In the lateral structures LSa in the example embodiment, the lateral conductive layer 172R and the etching protection layer 166 may have a shape of being partially recessed from the upper surfaces. The region in which the lateral conductive layer 172R and the etching protection layer 166 are recessed may be filled with the second electrode layer 174. Accordingly, upper surfaces of the lateral conductive layer 172R and the etching protection layer 166 may be in contact with the second electrode layer 174. In example embodiments, the recessed depth of the lateral conductive layer 172R and the etching protection layer 166 and the shape of the recessed upper surfaces may be varied.

The shapes of the lateral conductive layer 172R and the etching protection layer 166 described above may be formed by partially removing the lateral conductive layer 172R and the etching protection layer 166 from the upper surfaces thereof during the manufacturing process.

Referring to FIG. 4B, in a semiconductor device 100*b*, the shapes of the lateral structures LSb and the second electrode layer 174 may be different from those in the example embodiment in FIGS. 2A and 3. In the lateral structures LSb in the example embodiment, the etching protection layer 166 may have a bent shape covering the lower surface of the lateral protection layer 168, and the lateral conductive layer 172R may have a bent shape covering the lower surface of the etching protection layer 166. Accordingly, the second electrode layer 174 may be disposed only between the internal side surfaces of the lateral structures LSb, and may not include a region horizontally extending in a lower portion. In some example embodiments, the second electrode layer 174 may have a shape of being partially recessed into lower portions of the lateral structures LSb and partially horizontally extending to a region below the lateral structures LSb.

As in the example embodiments in FIGS. 3, 4A and 4B, the degree to which the lateral structures LSa and LSb are recessed from the upper surface and the lower surface may be varied in the example embodiments.

Figure 5A:
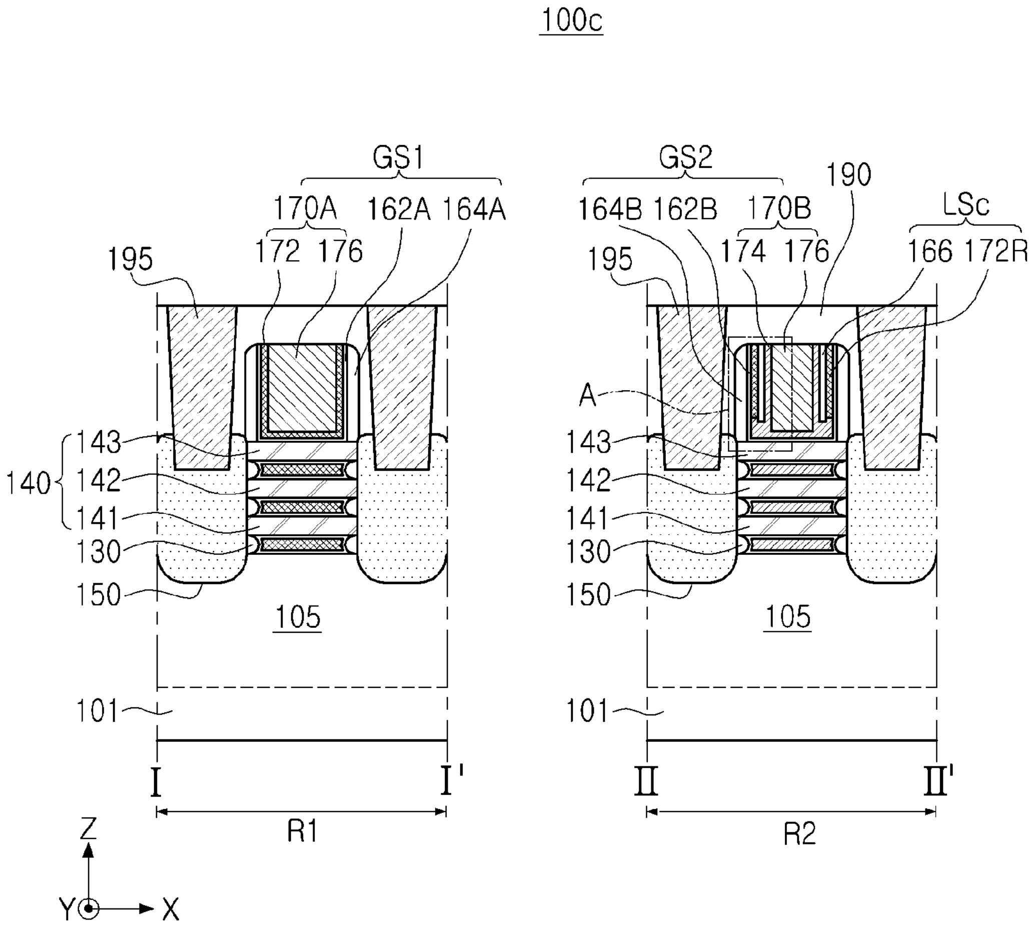
FIGS. 5A and 5B are cross-sectional views illustrating a semiconductor device and an enlarged view illustrating a portion of a semiconductor device according to an example embodiment of the present disclosure.
Figure 5B:
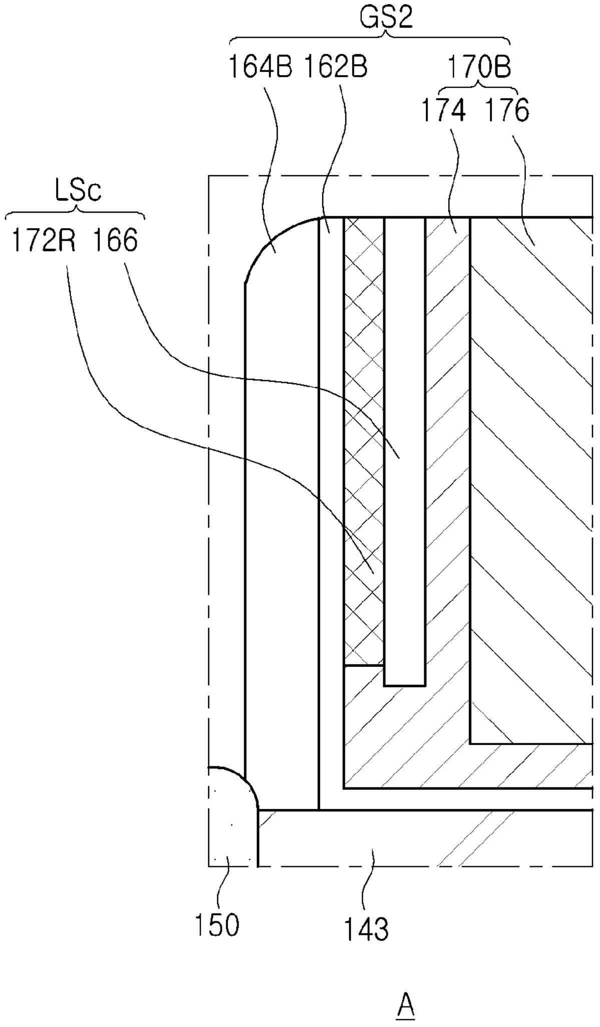

FIGS. 5A and 5B are cross-sectional views illustrating a semiconductor device and an enlarged view illustrating a portion of a semiconductor device according to an example embodiment.

Referring to FIGS. 5A and 5B, in a semiconductor device 100*c*, the lateral structures LSc may not include the lateral protection layer 168, differently from the example embodiment in FIGS. 2A and 3. Each of the lateral structures LSc may only include a lateral conductive layer 172R and an etching protection layer 166. An internal side surface of the etching protection layer 166 may be in contact with the second electrode layer 174. Even in this case, lower surfaces of the lateral conductive layer 172R and the etching protection layer 166 may be disposed on a level higher than a level of the lower surface of the second electrode layer 174.

The structure of the lateral structures LSc described above may be formed by removing the lateral protection layer 168 of FIGS. 2A and 3, for example, through a separate process.

Figure 6A:
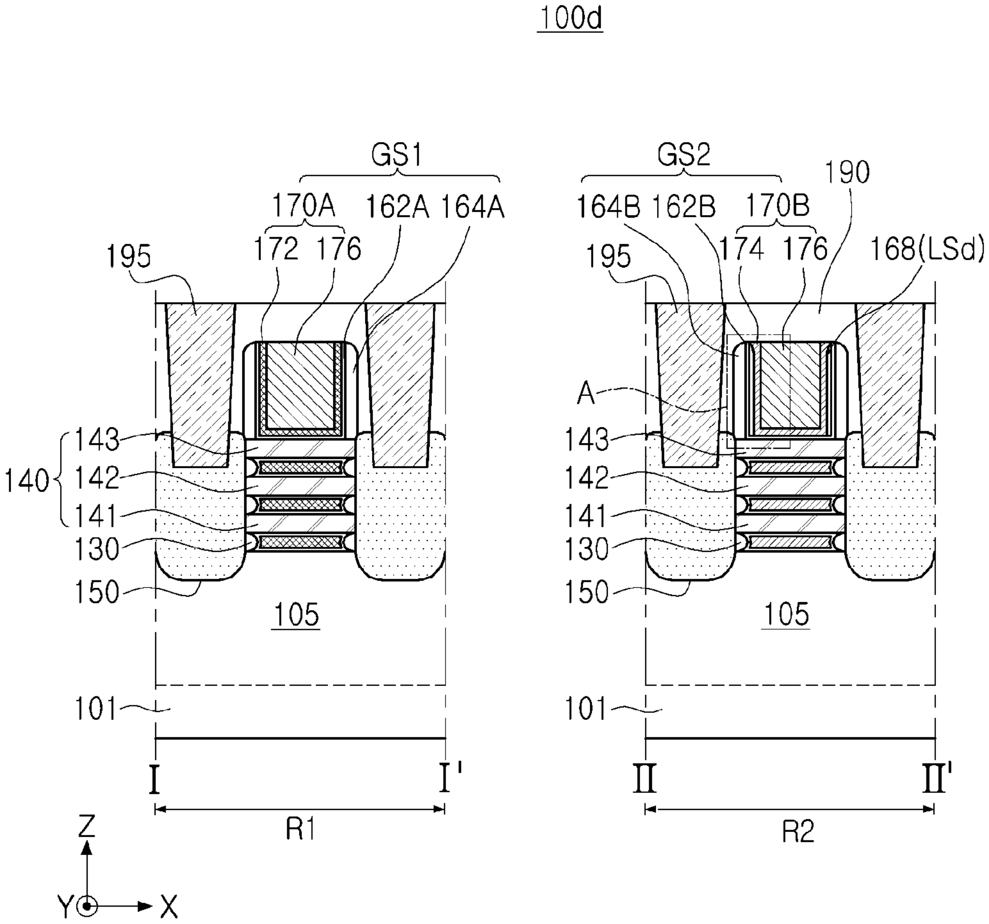
FIGS. 6A and 6B are cross-sectional views illustrating a semiconductor device and an enlarged view illustrating a portion of a semiconductor device according to an example embodiment of the present disclosure.
Figure 6B:
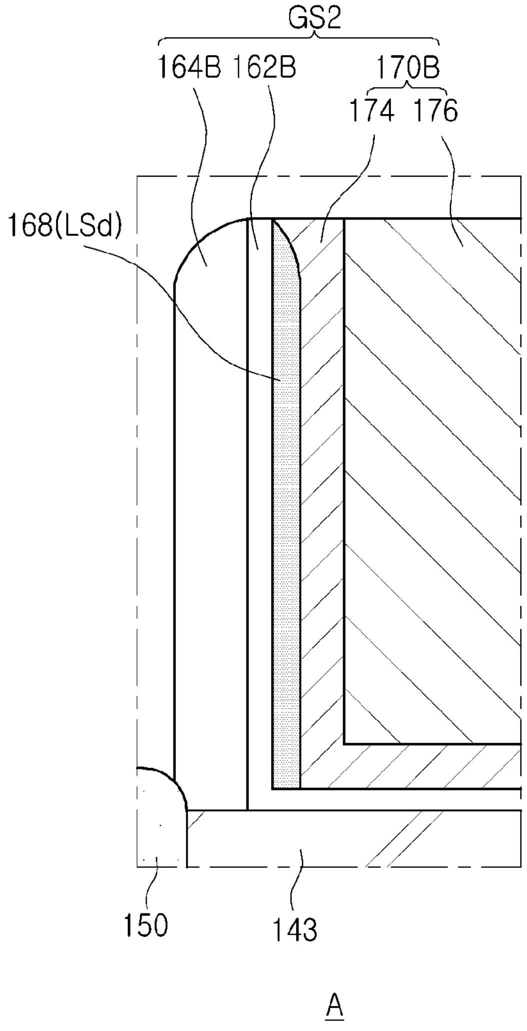

FIGS. 6A and 6B are cross-sectional views illustrating a semiconductor device and an enlarged view illustrating a portion of a semiconductor device according to an example embodiment.

Referring to FIGS. 6A and 6B, in a semiconductor device 100*d*, the lateral structures LSd may not include a lateral conductive layer 172R and an etching protection layer 166 differently from the example embodiment in FIGS. 2A and 3. Each of the lateral structures LSd may only include the lateral protection layer 168. An external side surface of the lateral protection layer 168 may be in contact with the second gate dielectric layer 162B.

The structure of the lateral structures LSd may be formed by removing the lateral conductive layer 172R and the etching protection layer 166 of FIGS. 2A and 3, for example, on the channel structures 140 through a separate process.

Figure 7A:
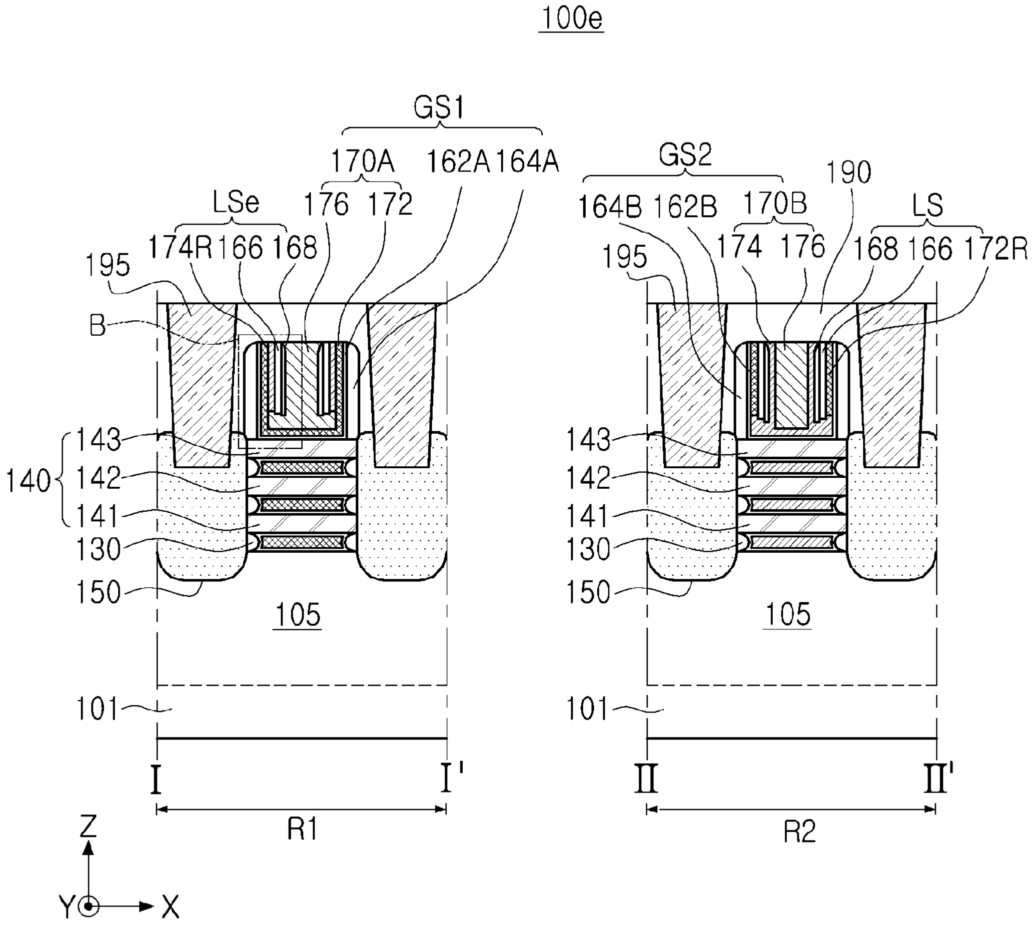
FIGS. 7A and 7B are cross-sectional views illustrating a semiconductor device and an enlarged view illustrating a portion of a semiconductor device according to an example embodiment of the present disclosure.
Figure 7B:
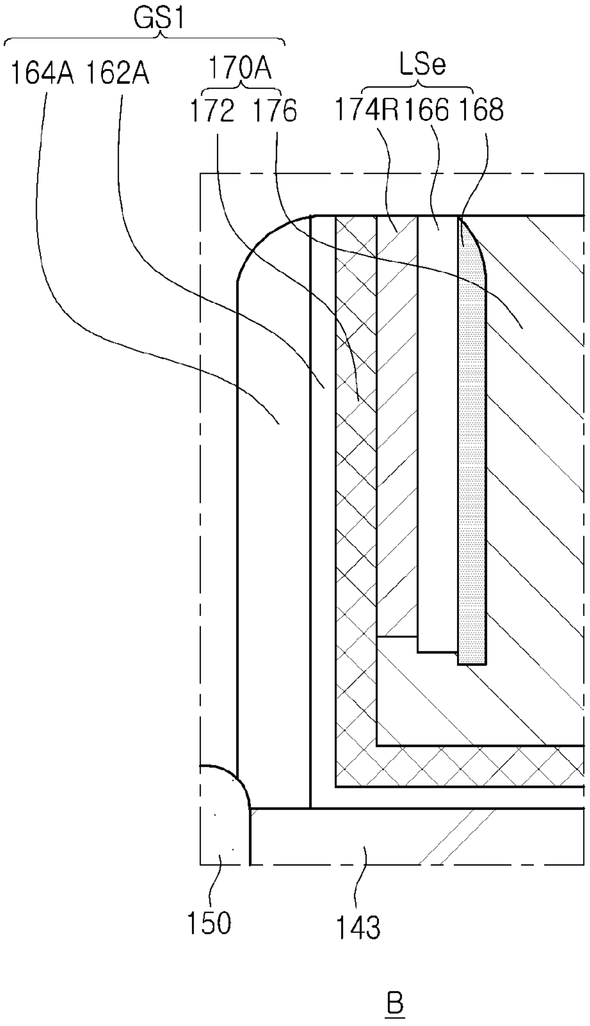

FIGS. 7A and 7B are cross-sectional views illustrating a semiconductor device and an enlarged view illustrating a portion of a semiconductor device according to an example embodiment.

Referring to FIGS. 7A and 7B, a semiconductor device 100*e* may include first lateral structures LSe in the first gate structures GS1 in the first region R1, and may include second lateral structures LS in the second gate structures GS2 in the second region R2. The semiconductor device 100*e* may further include the first lateral structures LSe, differently from the example embodiment in FIGS. 2A and 3. In the example embodiment, lateral structures of the second region R2 may be referred to as second lateral structures LS to be distinct from the first lateral structures LSe. The descriptions of the lateral structures LS described with reference to FIGS. 1 to 3 may be applied to the second lateral structures LS.

The first lateral structures LSe may extend in the Y-direction along the first gate structure GS1 and may be in contact with the gate isolation layer 180 (see FIG. 1) on one ends. The first lateral structures LSe may be disposed on the internal side surfaces of the first electrode layer 172, that is, for example, internal side surfaces of vertical portions of the first electrode layer 172, on the channel structure 140, and may be interposed between the first electrode layer 172 and the third electrode layer 176. The vertical portion of the first electrode layer 172 may refer to a region of the first electrode layer 172 extending in the Z-direction on internal side surfaces of the first gate spacer layers 164A. The first lateral structures LSe may be disposed on the vertical portions of the first electrode layers 172, respectively, and may be spaced apart from each other in the X-direction.

Lower surfaces of the first lateral structures LSe may be vertically spaced apart from the channel structure 140 and the horizontal portions of the first gate dielectric layer 162A. The lower surfaces of the first lateral structures LSe may be covered with the third electrode layer 176 and may be in contact with the third electrode layer 176. External side surfaces of the first lateral structures LSe may be in contact with the first electrode layer 172, and internal side surfaces of the first lateral structures LSe may be in contact with the third electrode layer 176. A level of the lower surfaces of the first lateral structures LSe may be higher than a level of the lower surface of the first gate spacer layers 164A and higher than a level of the lower surface of the first electrode layer 172. A length of the first lateral structures LSe in the Z-direction may be smaller than a length of the first gate spacer layers 164A in the Z-direction.

As illustrated in FIG. 7B, each of the first lateral structures LSe may include a lateral conductive layer 174R, an etching protection layer 166, and a lateral protection layer 168 stacked in order on the vertical portion of the first electrode layer 172. Levels of lower surfaces of the lateral conductive layer 174R, the etching protection layer 166, and the lateral protection layer 168 may be different from each other. The level of the lower surface of the lateral protection layer 168 may be the lowest, the level of the lower surface of the etching protection layer 166 may be higher than the level of the lower surface of the lateral protection layer 168, and the level of the lower surface of the lateral conductive layer 174R may be the highest, but an example embodiment thereof is not limited thereto. For example, the lower surface of the lateral protection layer 168 may be spaced apart from the upper surface of the horizontal portion of the first electrode layer 172 by a sum of the thickness of the lateral conductive layer 174R and the thickness of the etching protection layer 166. In example embodiments, lower surfaces of the lateral conductive layer 174R, the etching protection layer 166, and the lateral protection layer 168 may be curved.

The lateral conductive layer 174R may be a layer remaining after being formed together with the second electrode layer 174 of the second gate electrode 170B. Accordingly, the lateral conductive layer 174R may include or may be formed of the same material as that of the second electrode layer 174 and may include or may be formed of a conductive material.

The descriptions described with reference to FIGS. 1 to 3 may be applied to the etching protection layer 166 and the lateral protection layer 168 unless otherwise indicated. The lateral protection layer 168 may include a material different from those of the first gate dielectric layer 162A and the first gate spacer layers 164A. The lateral protection layer 168 may include or may be formed of a material different from those of the etching protection layer 166 and the second electrode layer 174. In example embodiments, the etching protection layers 166 of the first and second lateral structures LSe and LS may be formed of the same material or different materials, and the lateral protection layers 168 of the first and second lateral structures LSe and LS may be formed of the same material or different materials.

In example embodiments, the semiconductor device may include at least one of the first and second lateral structures LSe and LS.

Figure 8:
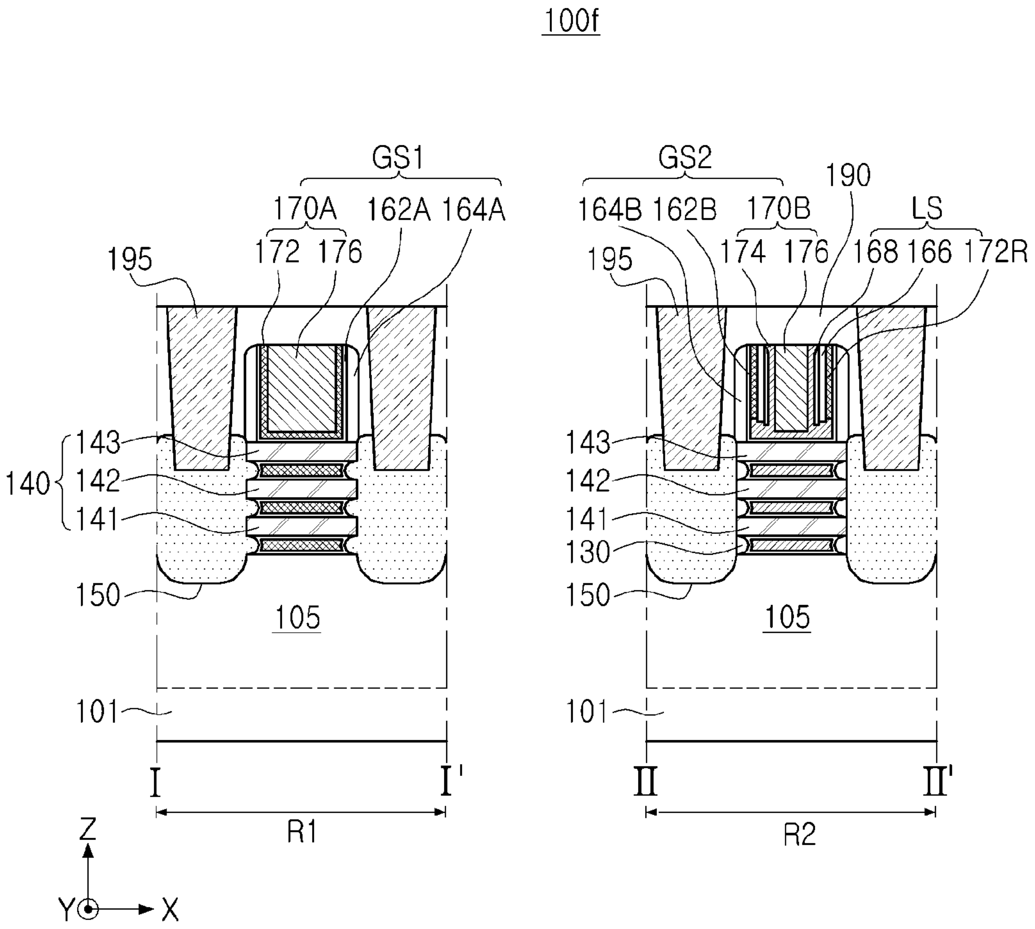
FIG. 8 is a cross-sectional view illustrating a semiconductor device according to an example embodiment of the present disclosure.

FIG. 8 is a cross-sectional view illustrating a semiconductor device according to an example embodiment.

Referring to FIG. 8, in a semiconductor device 100*f*, differently from the example embodiment in FIGS. 2 and 3, the internal spacer layer 130 may not be disposed in the first region R1. In this case, the source/drain regions 150 may have a shape expanding to a region in which the internal spacer layers 130 are not provided. Also, the first gate electrode 170A may be spaced apart from the source/drain regions 150 by the first gate dielectric layers 162A. In an example embodiment, the source/drain regions 150 may not expand to the region in which the internal spacer layers 130 are not provided, and the first gate electrode 170A may expand in the X-direction.

By including the structure described above, the internal spacer layer 130 may not be provided in the first region R1, such that the source/drain regions 150 may have improved crystallinity when the source/drain regions 150 are epitaxially grown. For example, when the source/drain regions 150 of the first region R1 include or are formed of SiGe, the internal spacer layer 130 may be selectively not provided only in the first region R1 as above to improve crystallinity of SiGe. However, in example embodiments, the internal spacer layer 130 may not be provided in at least one of the first region R1 and the second region R2.

Figure 9A:
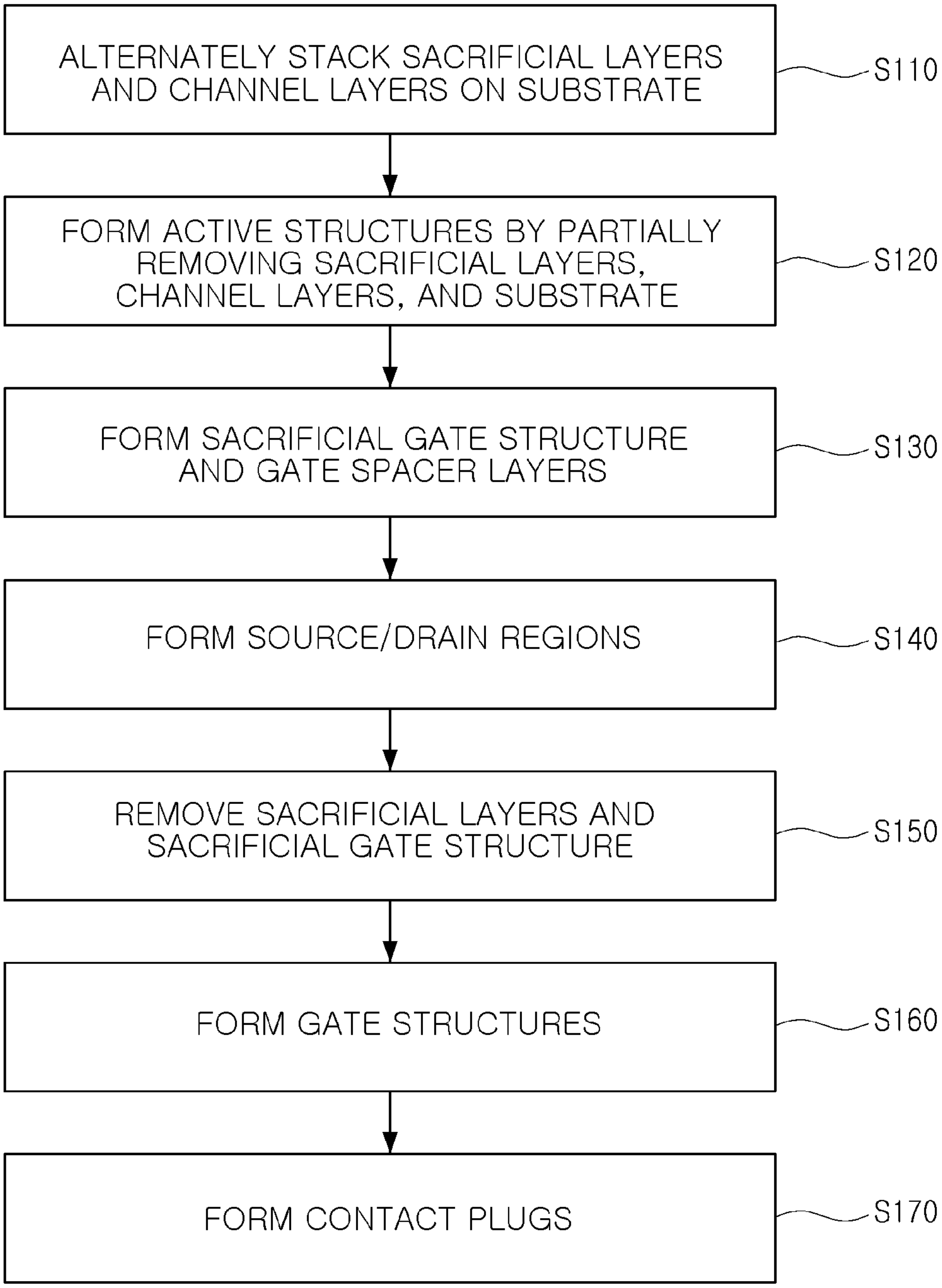
FIGS. 9A and 9B are flowcharts illustrating a method of manufacturing a semiconductor device according to an example embodiment of the present disclosure.
Figure 9B:
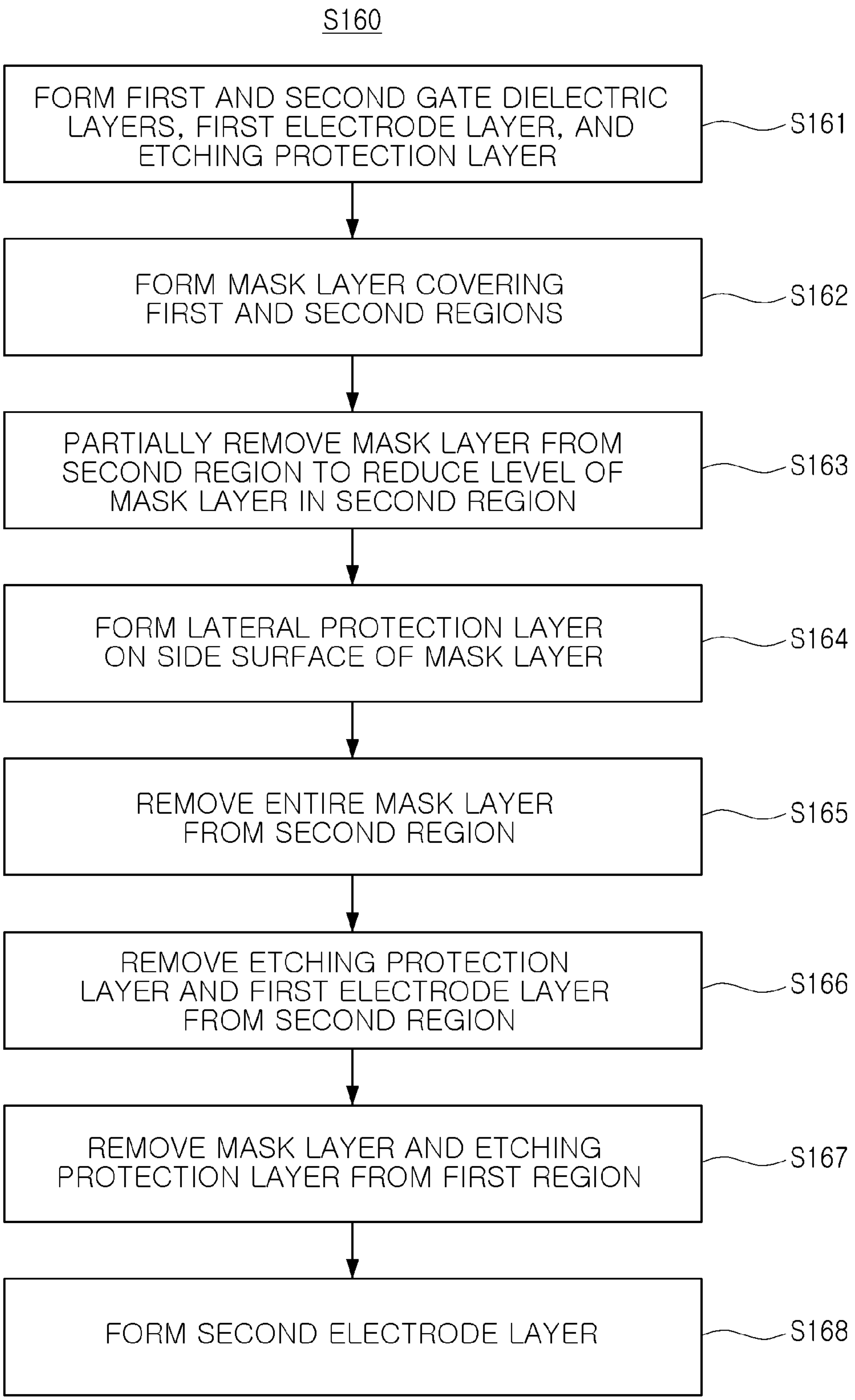

FIGS. 9A and 9B are flowcharts illustrating a method of manufacturing a semiconductor device according to an example embodiment.

FIGS. 10A to 22B are views illustrating processes of a method of manufacturing a semiconductor device in order according to an example embodiment. FIGS. 10A to 22B illustrate an example embodiment of a method of manufacturing the semiconductor device described with reference to FIGS. 1 to 3.

Figure 10A:
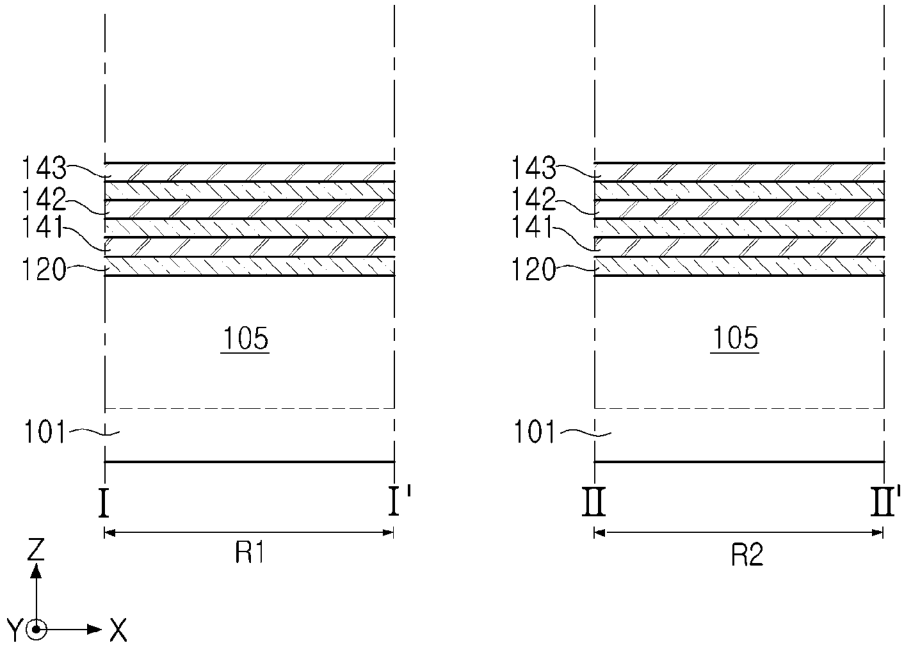
FIGS. 10A to 22B are views illustrating a method of manufacturing a semiconductor device in order according to an example embodiment of the present disclosure.
Figure 10B:
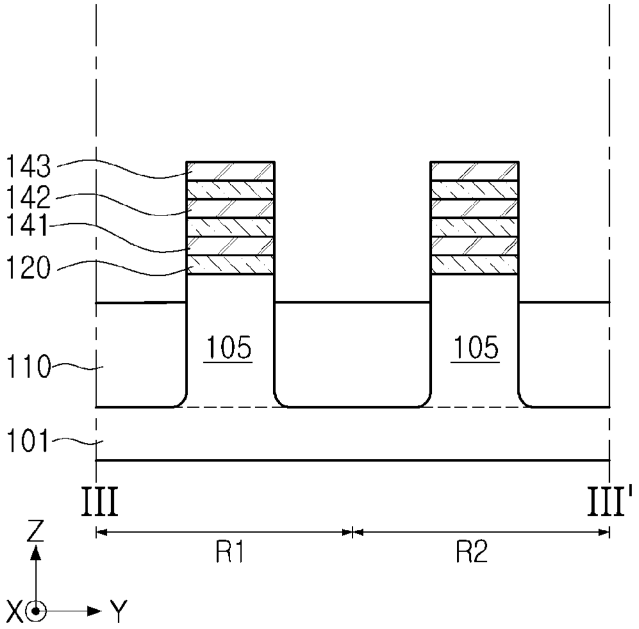

Referring to FIGS. 9A, 10A, and 10B, sacrificial layers 120 and first to third channel layers 141, 142, and 143 may be alternately stacked on a substrate 101 (S110), and active structures may be formed (S120).

The sacrificial layers 120 may be replaced with first and second gate dielectric layers 162A and 162B and first and second gate electrodes 170A and 170B, disposed below a third channel layer 143 as illustrated in FIGS. 2A and 2B. The sacrificial layers 120 may be formed of a material having etch selectivity with respect to the first to third channel layers 141, 142, and 143, respectively. The first to third channel layers 141, 142, and 143 may include a material different from that of the sacrificial layers 120. The sacrificial layers 120 and the first to third channel layers 141, 142, and 143 may include or may be formed of a semiconductor material including at least one of silicon (Si), silicon germanium (SiGe), and germanium (Ge), for example, may include or may be formed of different materials, and may include or may not include impurities. For example, the sacrificial layers 120 may include or may be formed of silicon germanium (SiGe), and the first to third channel layers 141, 142, and 143 may include or may be formed of silicon (Si).

The sacrificial layers 120 and the first to third channel layers 141, 142, and 143 may be formed by performing an epitaxial growth process from the substrate 101. Each of the sacrificial layers 120 and the first to third channel layers 141, 142, and 143 may have a thickness in a range of about 1 Å to about 100 nm. The number of layers of the channel layers 141, 142, and 143 alternately stacked with the sacrificial layers 120 may be varied in example embodiments.

Thereafter, the active structures may include sacrificial layers 120 and first to third channel layers 141, 142, and 143 alternately stacked with each other, and may further include active regions 105 formed by removing a portion of the substrate 101 and protruding from the substrate 101. The active structures may be formed in a linear shape extending in one direction, for example, the X-direction, and may be spaced apart from each other in the Y-direction.

In the region from which a portion of the substrate 101 is removed, a device isolation layer 110 may be formed by filling an insulating material and partially removing the insulating material for the active region 105 to protrude from an upper surface of the device isolation layer 119. The upper surface of the device isolation layer 110 may be disposed on a level lower than a level of an upper surface of the active region 105.

Figure 11A:
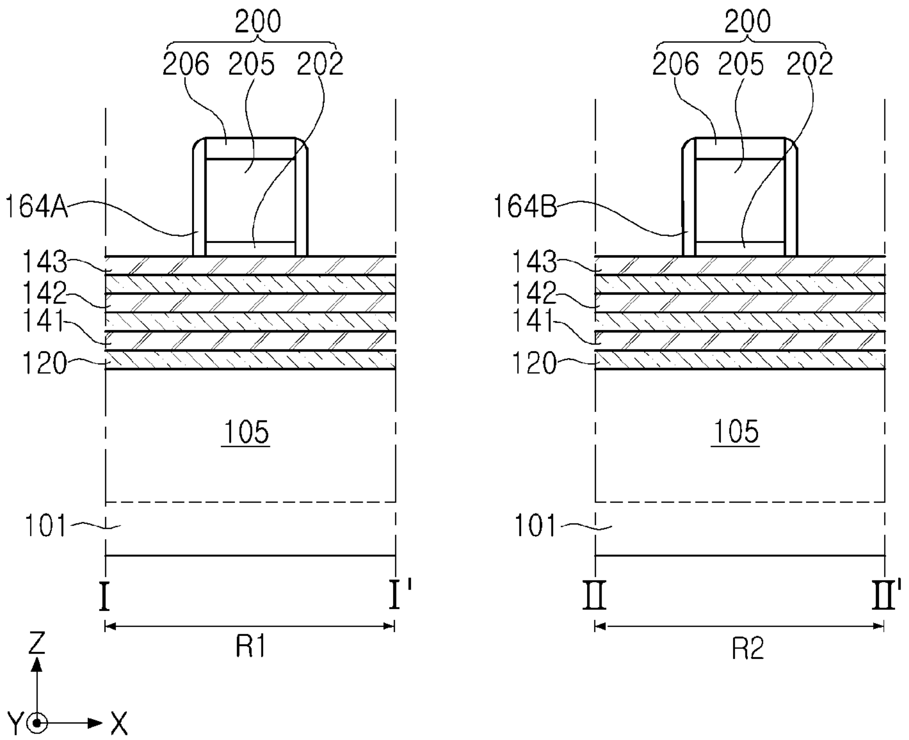
Figure 11B:
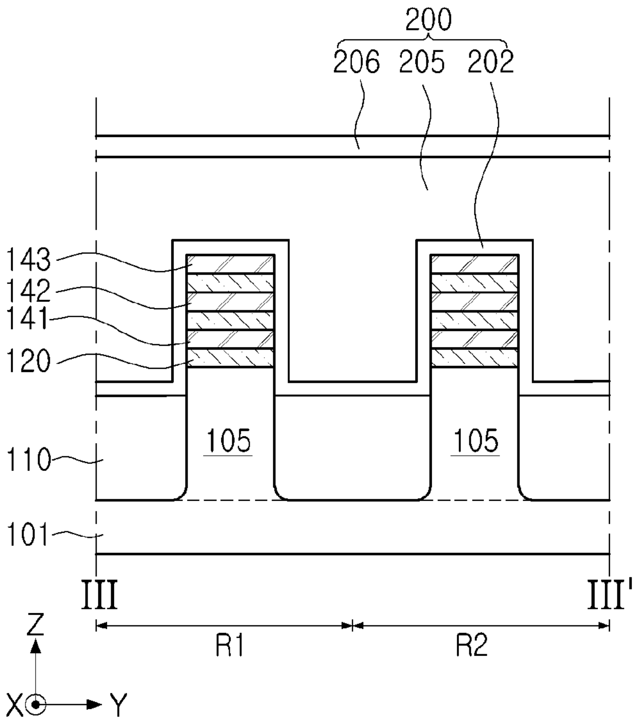

Referring to FIGS. 9A, 11A, and 11B, a sacrificial gate structure 200 and first and second gate spacer layers 164A and 164B may be formed on the active structures (S130).

The sacrificial gate structure 200 may be a sacrificial structure formed in a region in which the first and second gate dielectric layers 162A and 162B and the first and second gate electrodes 170A and 170B are to be formed on the channel structure 140 through a subsequent process as in FIGS. 2A and 2B. The sacrificial gate structure 200 may include first and second sacrificial gate layers 202 and 205 and a mask pattern layer 206 stacked in order. The first and second sacrificial gate layers 202 and 205 may be patterned using the mask pattern layer 206. The first and second sacrificial gate layers 202 and 205 may be an insulating layer and a conductive layer, respectively, but an example embodiment thereof is not limited thereto, and the first and second sacrificial gate layers 202 and 205 may be integrated with each other in a single layer. For example, the first sacrificial gate layer 202 may include or may be formed of silicon oxide, and the second sacrificial gate layer 205 may include or may be formed of polysilicon. The mask pattern layer 206 may include or may be formed of silicon oxide and/or silicon nitride. The sacrificial gate structure 200 may have a linear shape intersecting the active structures and extending in one direction. For example, the sacrificial gate structure 200 may extend along a straight line extending in the Y-direction. The sacrificial gate structure 200 may extend in the Y-direction, for example, and may be spaced apart from another sacrificial gate structure adjacent to the sacrificial gate structure 200 in the X-direction.

The first and second gate spacer layers 164A and 164B may be formed on opposite sidewalls of the sacrificial gate structure 200. The first and second gate spacer layers 164A and 164B may be formed together and may be connected with each other in the Y-direction. The first and second gate spacer layers 164A and 164B may be formed of a low-k dielectric material, and may include, for example, at least one of SiO, SiN, SiCN, SiOC, SiON, and SiOCN.

Figure 12A:
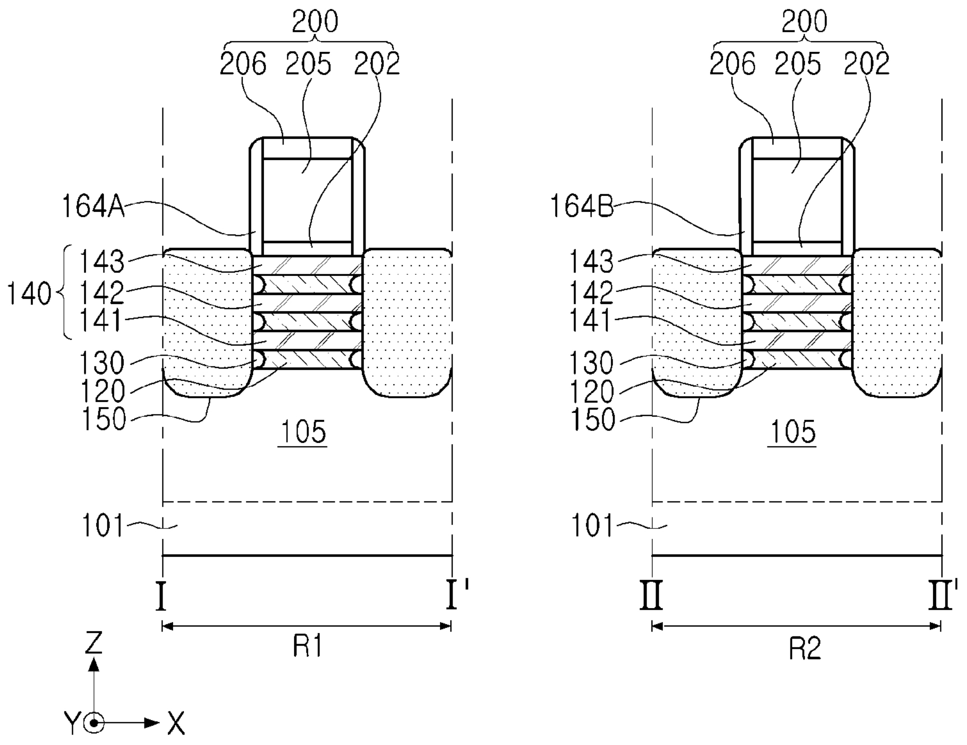
Figure 12B:
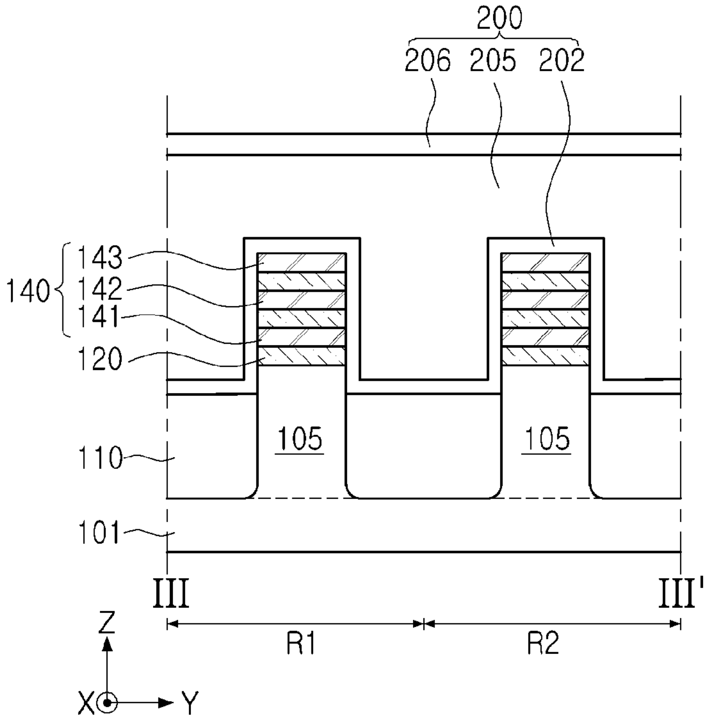

Referring to FIGS. 9A, 12A, and 12B, on an external side of the sacrificial gate structure 200, recess regions may be formed by partially removing the exposed sacrificial layers 120 and the first to third channel layers 141, 142, and 143, internal spacer layers 130 may be formed, and source/drain regions 150 filling the recess regions may be formed (S140).

First, recess regions may be formed by removing the exposed sacrificial layers 120 and the first to third channel layers 141, 142, and 143 using the sacrificial gate structure 200 and the first and second gate spacer layers 164A and 164B as masks. Accordingly, the first to third channel layers 141, 142, and 143 may be patterned to form the channel structure 140 having a predetermined length in the X-direction.

Thereafter, a portion of the sacrificial layers 120 may be removed. The sacrificial layers 120 may be selectively etched with respect to the channel structure 140 by, for example, a wet etching process, and may be removed from the side surface in the X-direction by a predetermined depth. The sacrificial layers 120 may have side surfaces inwardly curved by the etching the side surface as described above. However, the shape of the side surfaces of the sacrificial layers 120 is not limited to the illustrated example.

Thereafter, the internal spacer layers 130 may be formed in the region from which the sacrificial layers 120 are partially removed. The internal spacer layers 130 may be formed of the same material as that of the first and second gate spacer layers 164A and 164B, but an example embodiment thereof is not limited thereto. For example, the internal spacer layers 130 may include or may be formed of at least one of SiN, SiCN, SiOCN, SiBCN, and SiBN.

Thereafter, the source/drain regions 150 may be formed by growing from the upper surface of the active regions 105 and side surfaces of the channel structures 140 by a selective epitaxial process, for example. The source/drain regions 150 may include impurities doped by in-situ doping, and may include a plurality of layers having different doping elements and/or doping concentrations.

Figure 13A:
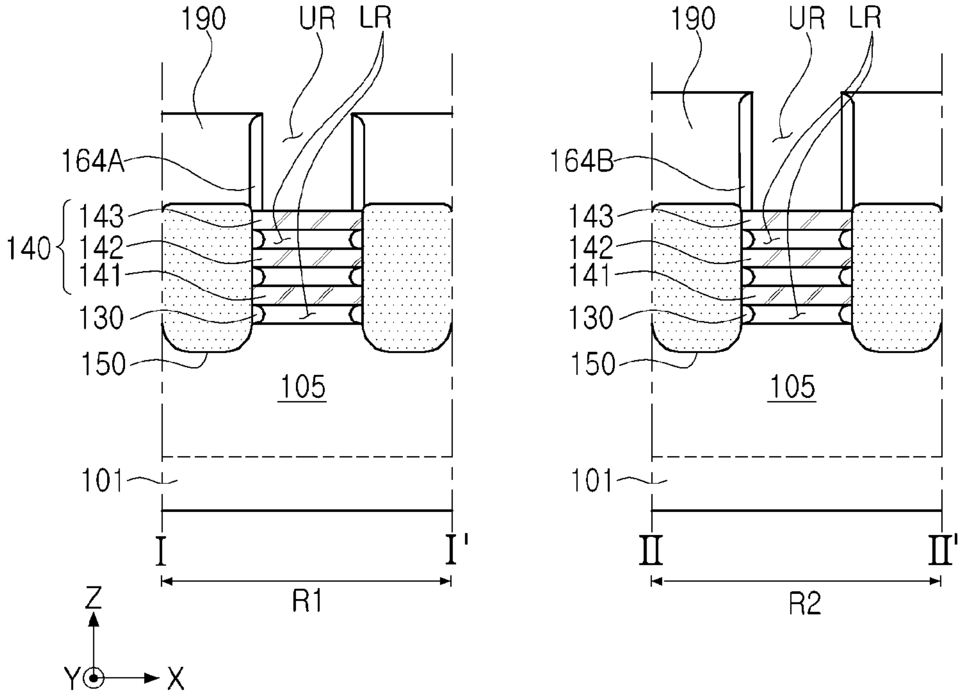
Figure 13B:
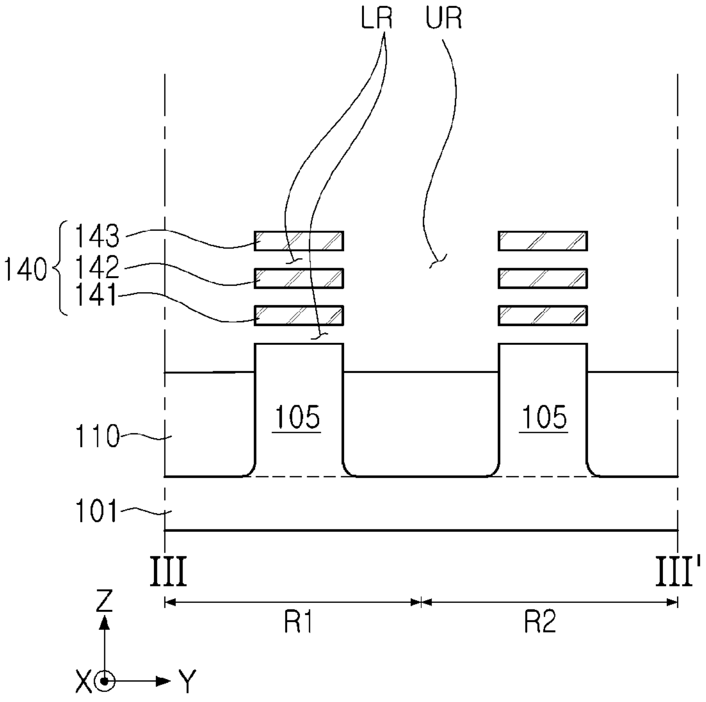

Referring to FIGS. 9A, 13A, and 13B, after the interlayer insulating layer 190 is formed, the sacrificial layers 120 and the sacrificial gate structure 200 may be removed (S150).

The interlayer insulating layer 190 may be formed by forming an insulating layer covering the sacrificial gate structure 200 and the source/drain regions 150 and performing a planarization process.

The sacrificial layers 120 and the sacrificial gate structure 200 may be selectively removed with respect to the first and second gate spacer layers 164A and 164B, the interlayer insulating layer 190, and the channel structures 140. First, an upper gap region UR may be formed by removing the sacrificial gate structure 200, and lower gap regions LR may be formed by removing the sacrificial layers 120 exposed through the upper gap region UR. For example, when the sacrificial layers 120 include or are formed of silicon germanium (SiGe) and the channel structures 140 include or are formed of silicon (Si), the sacrificial layers 120 may be selectively removed by performing a wet etching process using peracetic acid as an etchant. During the removal process, the source/drain regions 150 may be protected by the interlayer insulating layer 190 and the internal spacer layers 130.

Hereinafter, the process of forming the first and second gate structures GS1 and GS2 (S160) will be described with reference to FIGS. 9B and 14A to 22B.

Figure 14A:
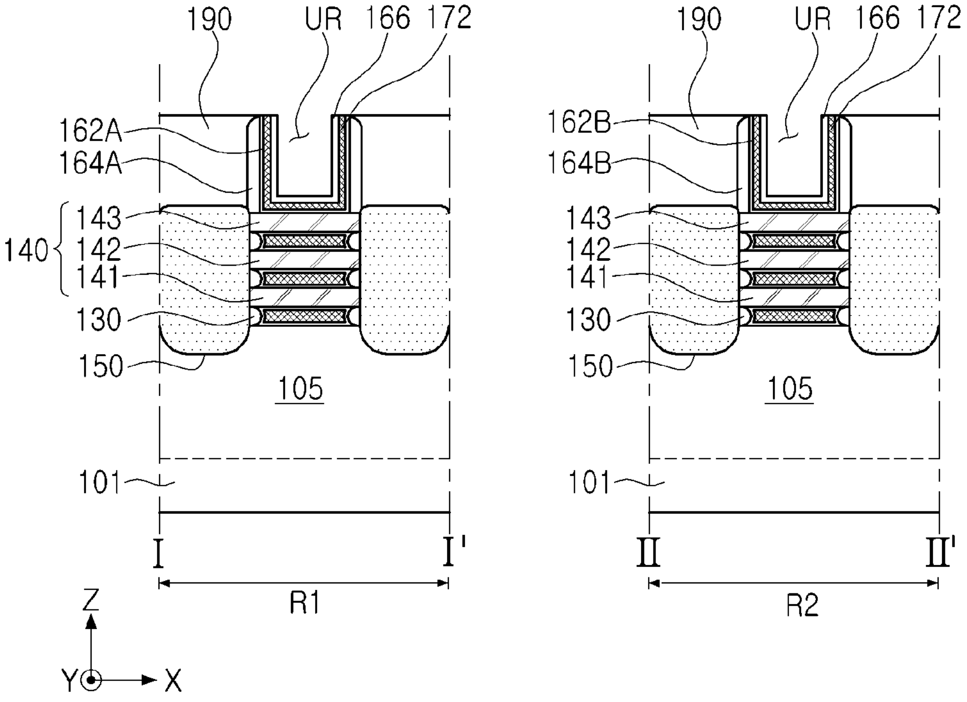
Figure 14B:
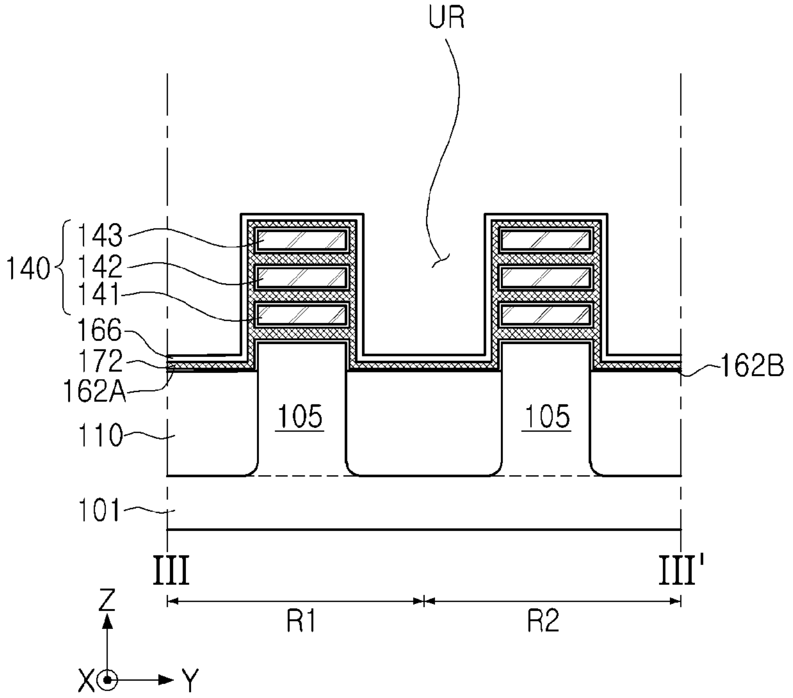

First, referring to FIGS. 9B, 14A, and 14B, first and second gate dielectric layers 162A and 162B, a first electrode layer 172, and an etching protection layer 166 may be formed (S161).

The first and second gate dielectric layers 162A and 162B may be formed to conformally cover internal side surfaces of the upper gap region UR and the lower gap regions LR. In some example embodiments, in this process, the entire first gate dielectric layers 162A may be formed in the first region R1, and a portion of the second gate dielectric layers 162B may be formed in the second region R2. In this case, the other portions of the second gate dielectric layers 162B may be further formed before the second electrode layer 174 is formed in a subsequent process.

The first electrode layer 172 may be formed to fill the lower gap regions LR and to conformally cover the first and second gate dielectric layers 162A and 162B in the upper gap region UR. For example, the first electrode layer 172 may be formed to have a uniform thickness using an atomic layer deposition (ALD) method.

The etching protection layer 166 may be formed to conformally cover the first electrode layer 172 in the upper gap region UR. The etching protection layer 166 may prevent the mask layer ML (see FIGS. 15A and 15B) from filling a region between the channel structures 140 and may allow the mask layer ML to be easily removed from a region between the channel structures 140 in a subsequent process. The etching protection layer 166 may include a material easily and selectively removed by a wet etching process during a subsequent process. For example, the etching protection layer 166 may include or may be formed of TiAlN or TiN.

Figure 15A:
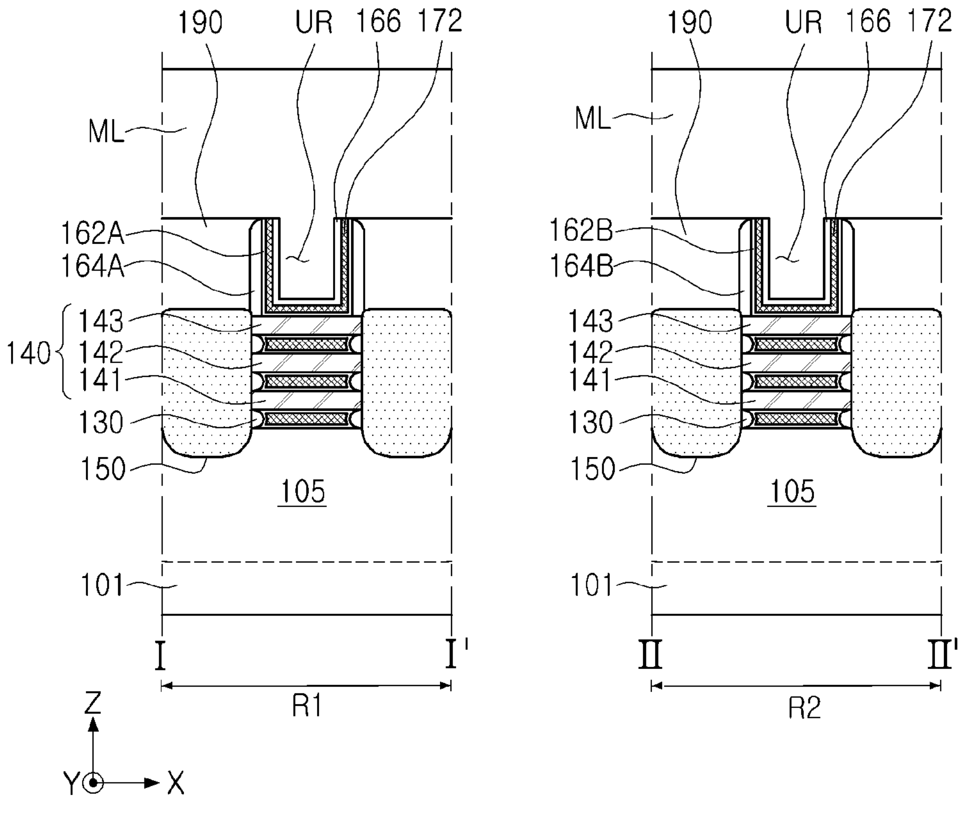
Figure 15B:
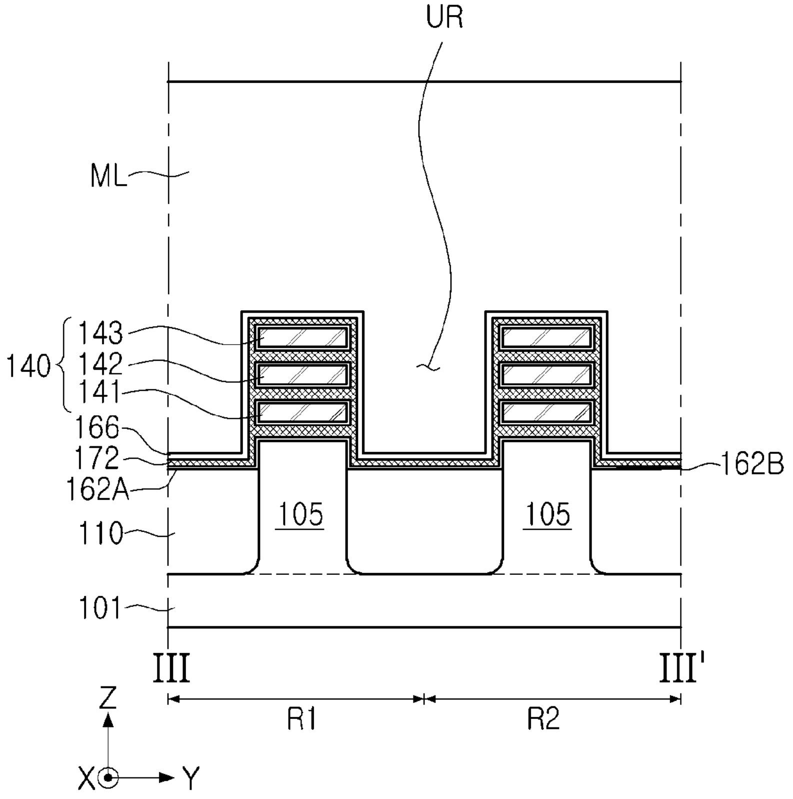

Referring to FIGS. 9B, 15A, and 15B, a mask layer ML covering the first and second regions R1 and R2 may be formed (S162).

The mask layer ML may be formed on the interlayer insulating layer 190. The mask layer ML may be a layer to remove the first electrode layer 172 from the second region R2 by exposing the second region R2 after being patterned in a subsequent process. For example, the mask layer ML may be patterned to expose the second region R2 to remove the first electrode layer 172 in the second region R2. The mask layer ML may be, for example, a bottom anti-reflective coating, and may include or may be formed of an organic material or an inorganic material such as carbide, but an example embodiment thereof is not limited thereto.

Figure 16A:
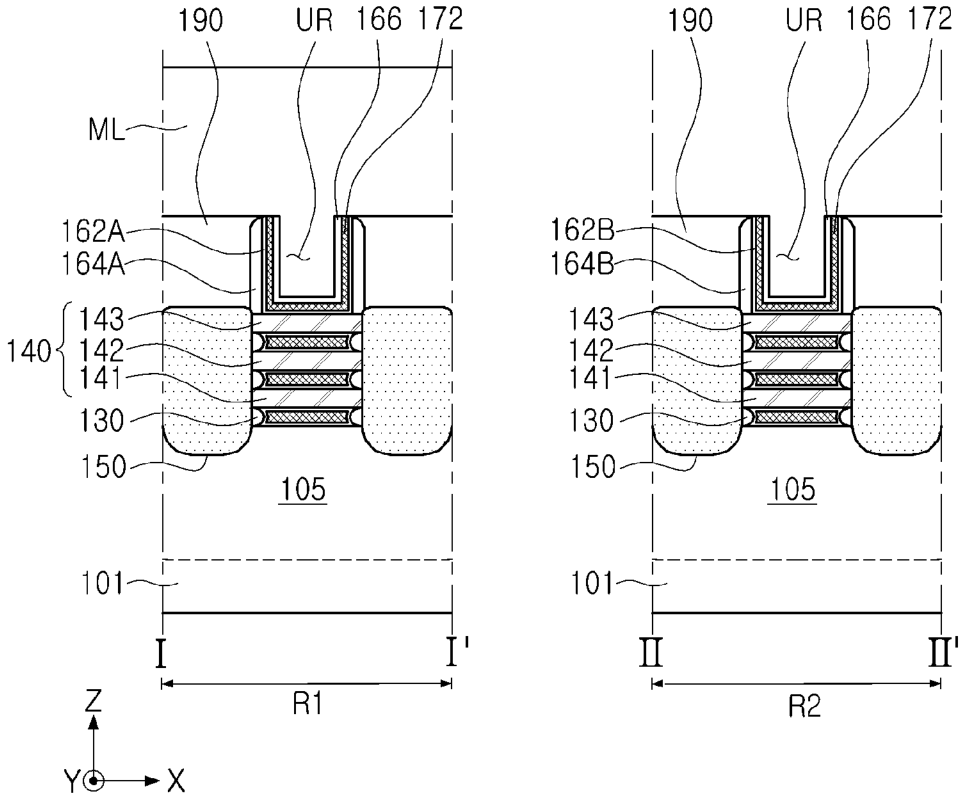
Figure 16B:
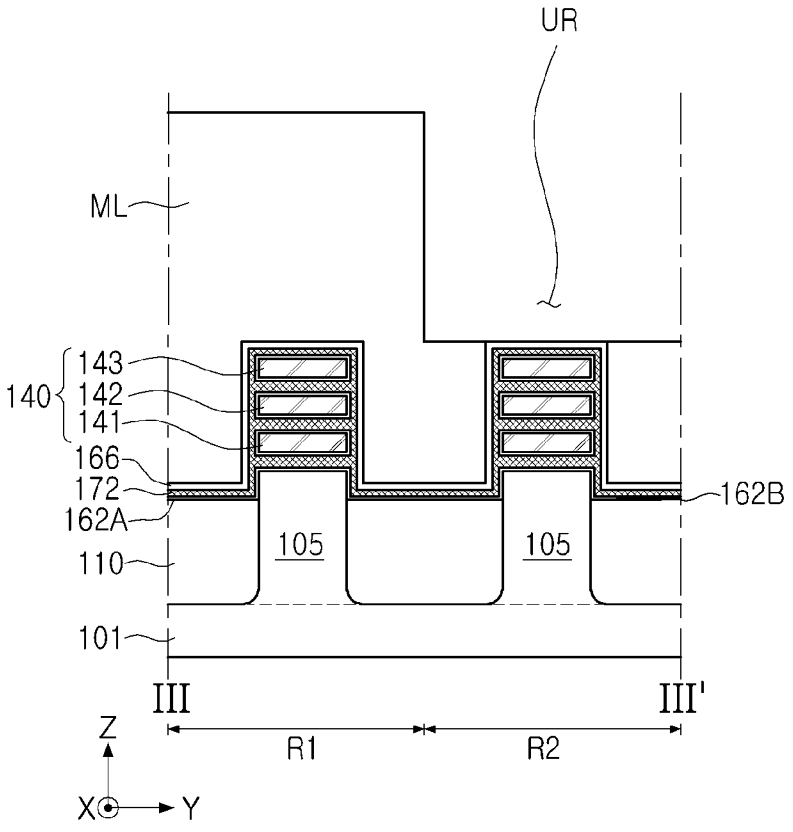

Referring to FIGS. 9B, 16A, and 16B, the mask layer ML may be partially removed to decrease a level of the mask layer ML in the second region R2 (S163).

First, the second region R2 may be exposed using a patterning layer formed on the mask layer ML. Thereafter, the exposed mask layer ML may be primarily etched to remove an upper portion of the mask layer ML to decrease the level of the mask layer ML. The mask layer ML may be removed to expose the upper surface of the etching protection layer 166 on the third channel layer 143 in the cross-sectional view in FIG. 16B, or may be removed to partially remain on the upper surface of the etching protection layer 166. For example, in the second region R2, the upper surface of the mask layer ML may be disposed on a level the same as or higher than a level of the upper surface of the etching protection layer 166. In some example embodiments, the etching protection layer 166 may be used as an etch stop layer in this process.

In this process, in the cross-sectional surface taken in the X-direction in FIG. 16A, the etching protection layer 166 may be exposed through the upper gap region UR in a region between the second gate spacer layers 164B of the second region R2. A level of the lower end of the lateral protection layer 168 of the lateral structure LS (see FIGS. 2A and 2B) formed subsequently may change depending on the level of the upper surface of the mask layer ML after the partially removing in this process. For example, when the level of the upper surface of the mask layer ML is relatively high, the level of the lower surface of the lateral protection layer 168 may also be higher.

The example embodiment in FIGS. 6A and 6B may be manufactured by removing the etching protection layer 166 and the first electrode layer 172 exposed through the upper gap region UR from the second region R2, in this process.

Referring to FIGS. 9B and 17A to 18B, a lateral protection layer 168 may be formed on the side surface of the mask layer ML (S164).

Figure 17A:
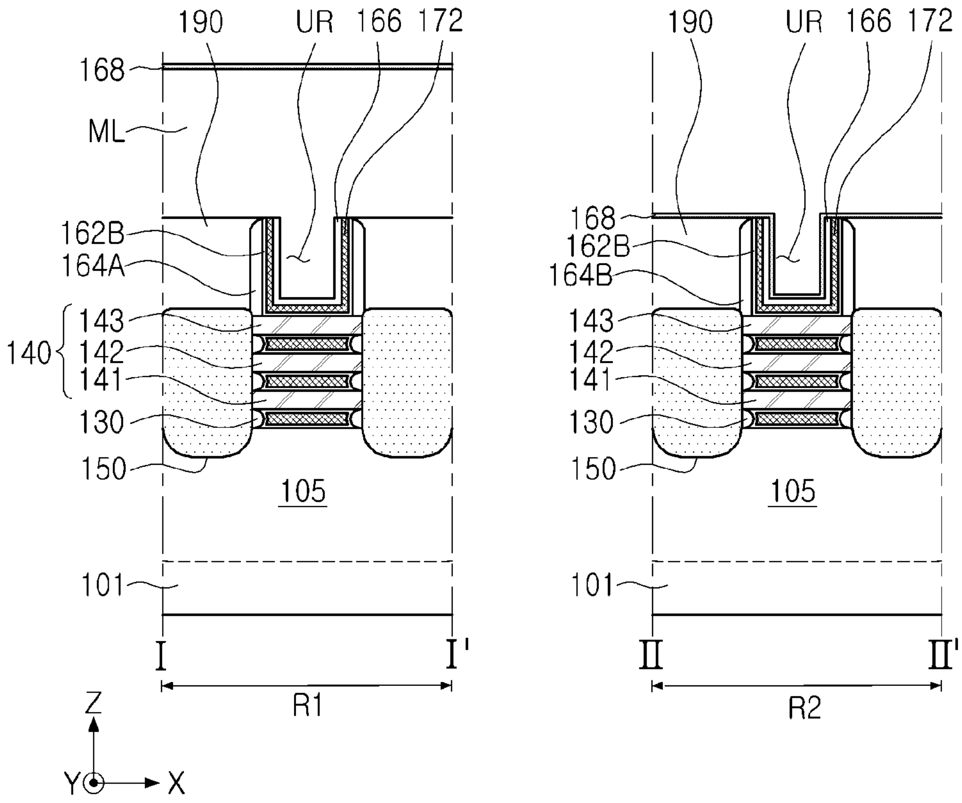
Figure 17B:
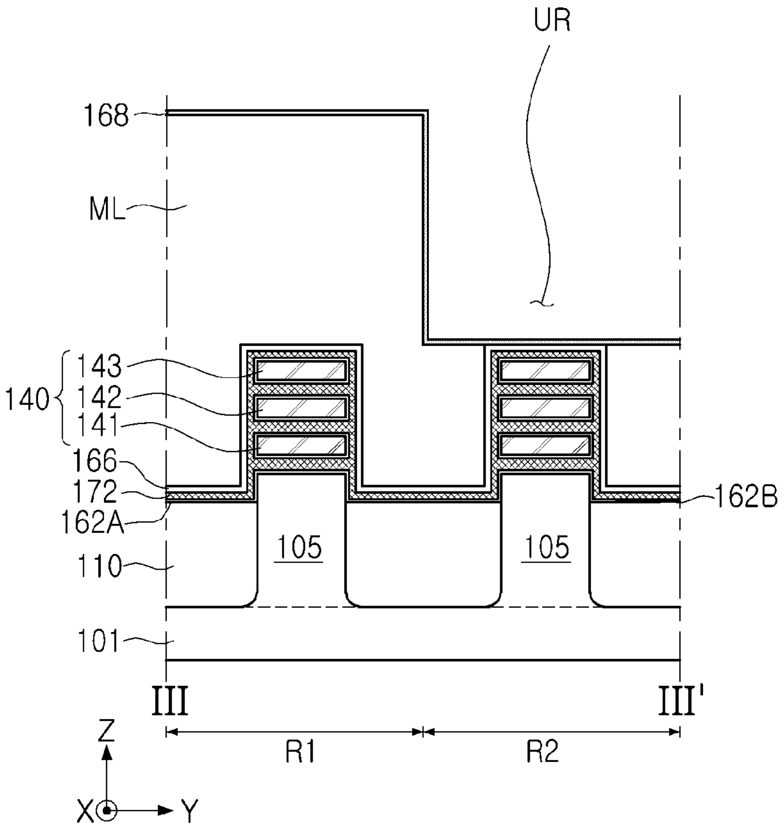

First, referring to FIGS. 17A and 17B, a lateral protection layer 168 may be deposited on the entire first and second regions R1 and R2. The lateral protection layer 168 may be provided to strengthen the side surface of the mask layer ML by protecting the side surface on a boundary between the first and second regions R1 and R2. The lateral protection layer 168 may be formed of an inorganic material, and may be, for example, a $TiO_2$ layer. The lateral protection layer 168 may also be formed on the etching protection layer 166 in the upper gap region UR of the second region R2.

Figure 18A:
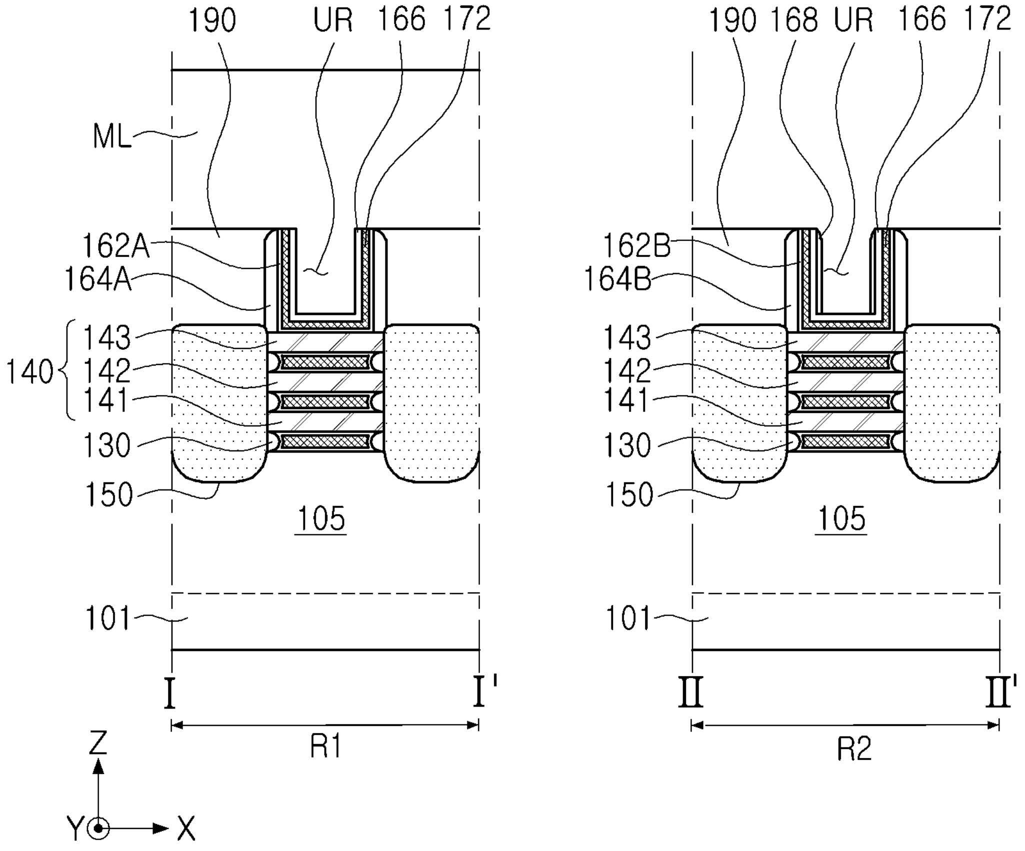
Figure 18B:
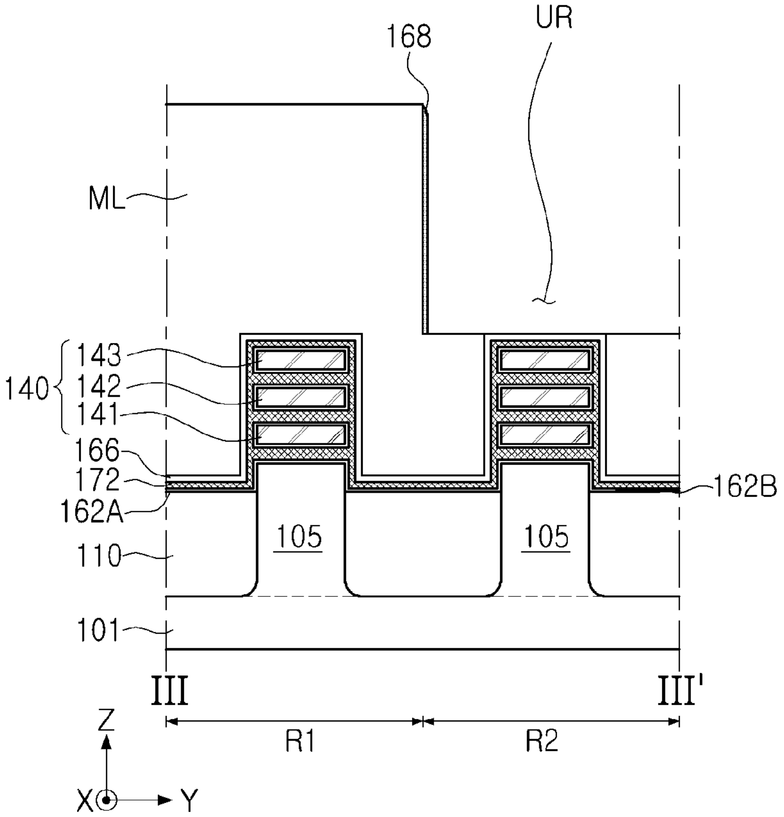

Thereafter, referring to FIGS. 18A and 18B, the lateral protection layer 168 may be partially removed such that the lateral protection layer 168 may remain on the side surface of the mask layer ML. For example, the lateral protection layer 168 may be partially removed from the upper surface of the mask layer ML using an etch-back process. By this process, the lateral protection layer 168 may remain on the side surface of the mask layer ML on a boundary between the first and second regions R1 and R2. The lateral protection layer 168 also may remain on internal side walls of the upper gap region UR of the second region R2 in the cross-sectional view in the X-direction. The lateral protection layer 168 may have a thickness of, for example, about 1 nm to about 10 nm, but an example embodiment thereof is not limited thereto. Terms such as “about” or “approximately” may reflect amounts, sizes, orientations, or layouts that vary only in a small relative manner, and/or in a way that does not significantly alter the operation, functionality, or structure of certain elements. For example, a range from “about 0.1 to about 1” may encompass a range such as a 0%-5% deviation around 0.1 and a 0% to 5% deviation around 1, especially if such deviation maintains the same effect as the listed range.

Figure 19A:
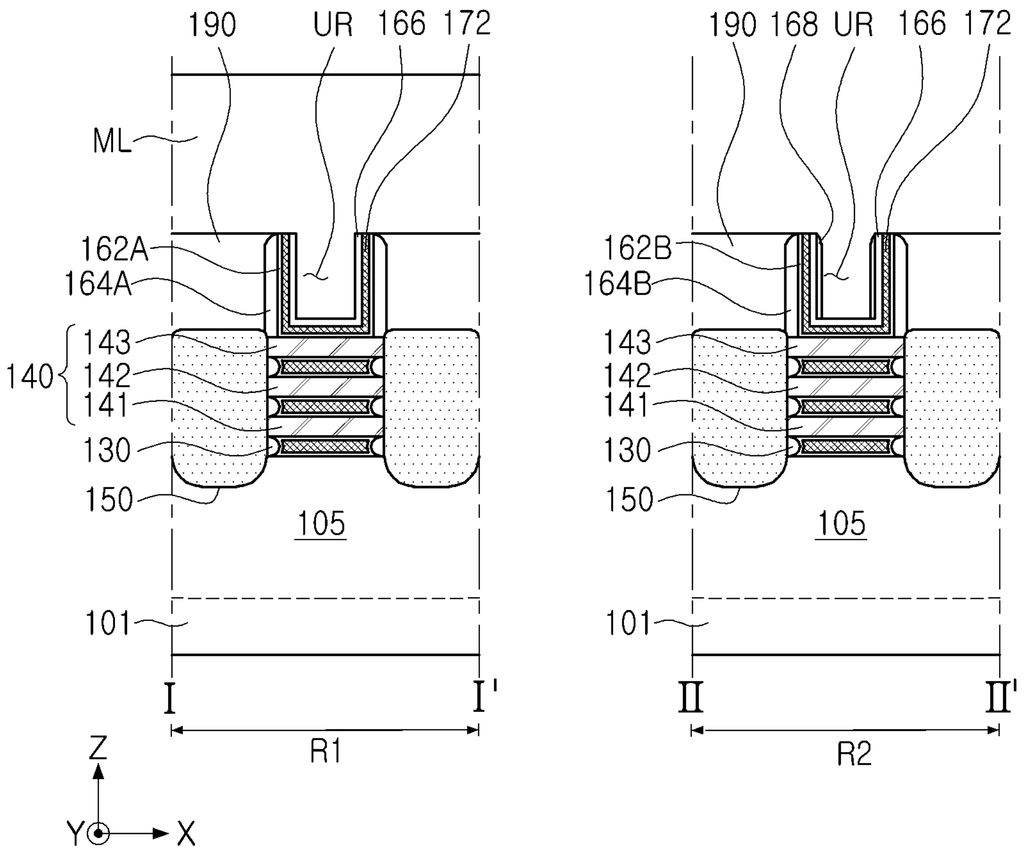
Figure 19B:
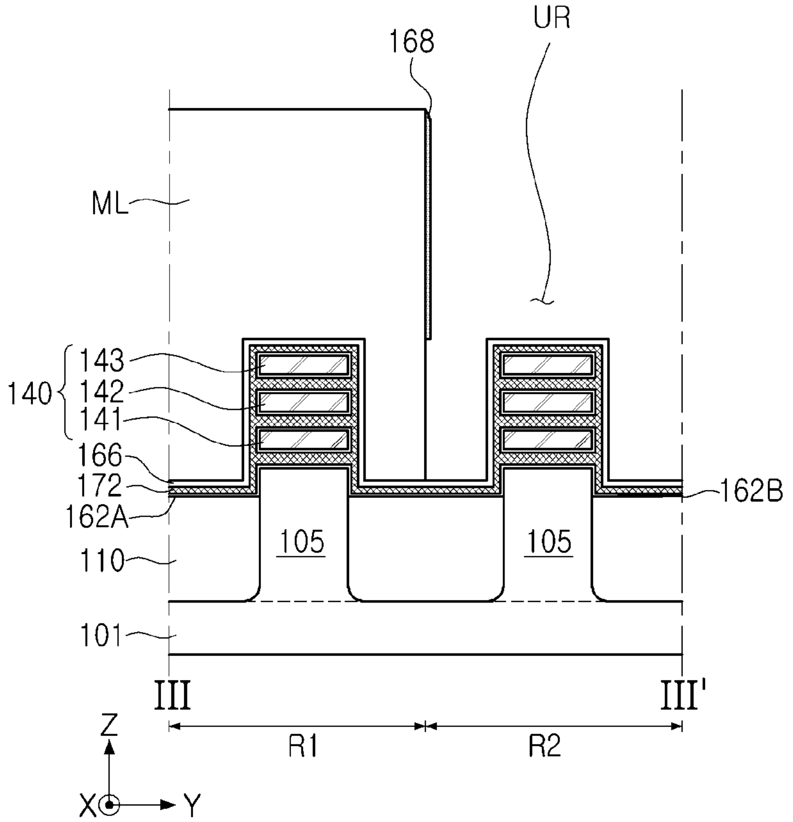

Referring to FIGS. 9B, 19A, and 19B, the mask layer ML may be entirely removed from the second region R2 (S165).

By secondarily etching the exposed mask layer ML, the mask layer ML may be removed from the second region R2. For example, the mask layer ML may be removed from the second region R2 using a two-step etching process in which the mask layer ML of the second region R2 is partially removed as shown in FIGS. 16A and 16B in a first etching process, and the remaining of the mask layer ML of the second region R2 is removed as shown in FIGS. 19A and 19B using the lateral protection layer 168 as shown in FIGS. 18A and 18B in a second etching process. Since the upper portion of the side surface of the mask layer ML may be protected and strengthened by the lateral protection layer 168, a vertical side profile may be maintained to a lower end in the secondarily etched region. For example, with the lateral protection layer 168 covering the upper portion of the side surface of the mask layer ML, the lower portion of the mask layer ML may be protected in the second etching process of the two-step etching process so that a vertical side profile of the mask layer ML may be maintained as vertical at the boundary between the first region R1 and the second region R2.

As described above, in the example embodiment, after the upper portion of the mask layer ML is primarily etched, the lateral protection layer 168 may be formed, and the remaining portion may be etched, such that a defect in which a tail of the mask layer ML remains in the second region R2 may be prevented, and accordingly, a defect in which the first electrode layer 172 remains in the second region R2 in a subsequent process may be prevented. Accordingly, electrical properties and reliability of the semiconductor device 100 may improve.

Figure 20A:
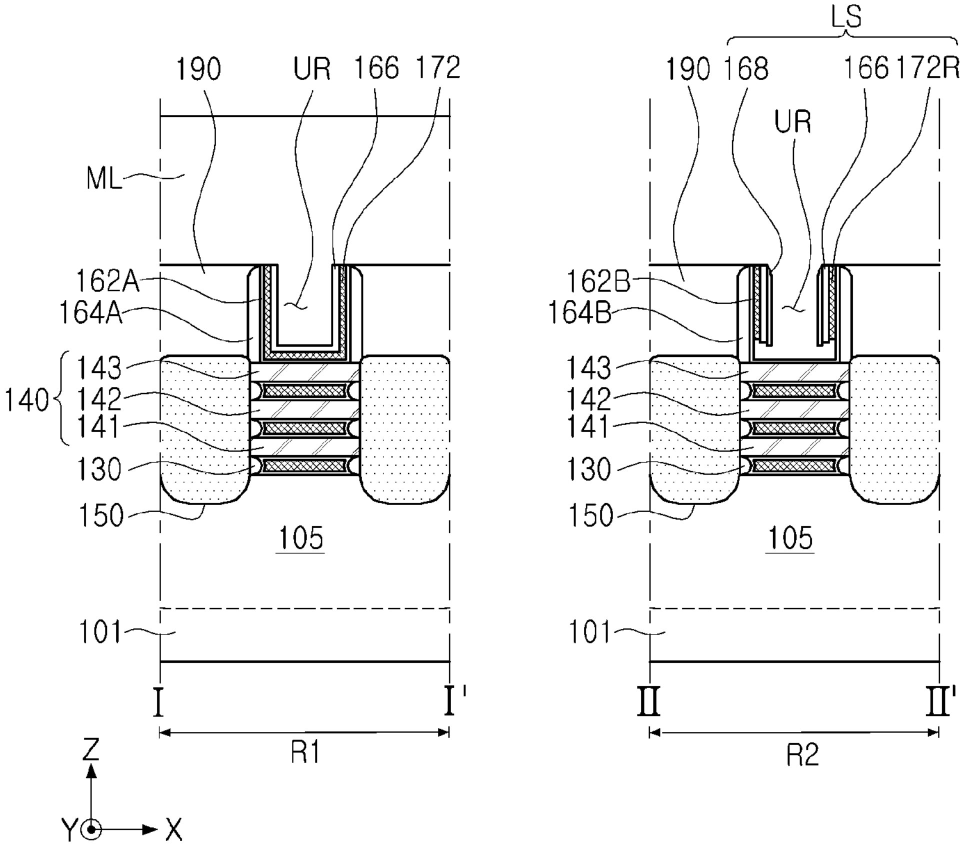
Figure 20B:
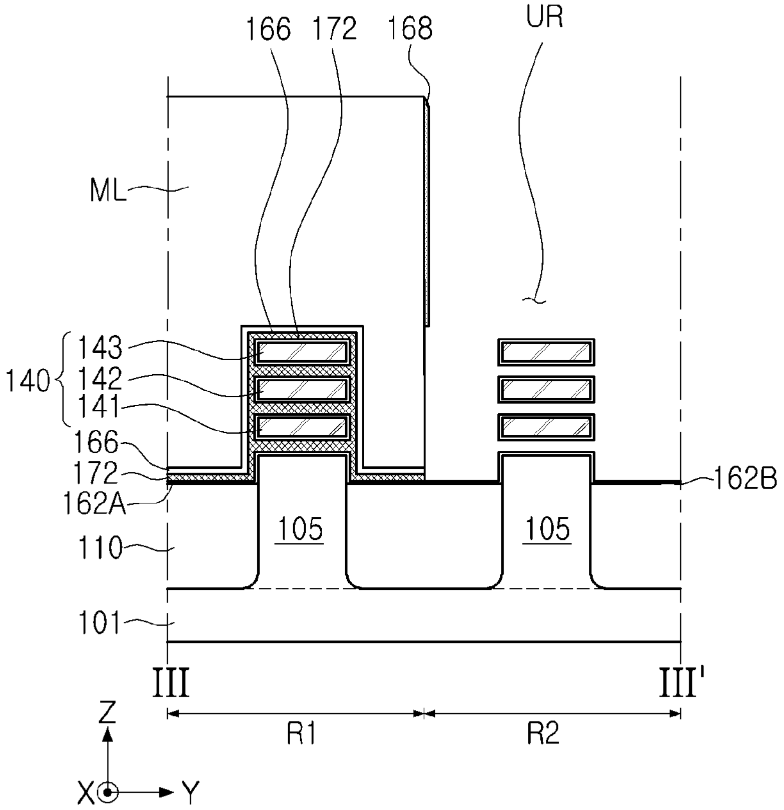

Referring to FIGS. 9B, 20A, and 20B, the etching protection layer 166 and the first electrode layer 172 may be removed from the second region R2 (S166).

The etching protection layer 166 and the first electrode layer 172 may be removed in sequence. The etching protection layer 166 and the first electrode layer 172 may be removed by a wet etching process and/or a dry etching process.

In this process, since the lateral protection layers 168 are formed on the internal side walls of the upper gap region UR of the second region R2 in the cross-sectional view in the X-direction, the etching protection layer 166 and the first electrode layer 172 on the internal side walls may be covered with the lateral protection layers 168 such that at least a portion thereof may not be removed and may remain. For example, in the upper gap region UR, horizontal regions of the etching protection layer 166 and the first electrode layer 172 that are exposed upwards may be removed, and a portion thereof may be removed from the lower portion and/or the upper portion in a region between the second gate spacer layers 164B and the lateral protection layers 168. In an embodiment, the etching protection layer 166 and the first electrode layer 172 may not be removed from a region between the second gate spacer layers 164B and the lateral protection layers 168. Accordingly, the lateral structure LS including the lateral conductive layer 172R, the etching protection layer 166, and the lateral protection layer 168 stacked in order from the second gate dielectric layer 162B may be formed.

In some example embodiments, a process of removing the lateral protection layer 168 may be further performed before the etching protection layer 166 and the first electrode layer 172 are removed. In this case, the lateral structures LS may not be formed on internal side walls of the upper gap region UR of the second region R2. In some embodiments, the lateral structure LS may not be formed even when the lateral protection layer 168 is also removed while the etching protection layer 166 is removed.

The example embodiment in FIGS. 5A and 5B may be manufactured by removing the lateral protection layer 168, after the etching protection layer 166 and the first electrode layer 172 are removed.

Figure 21A:
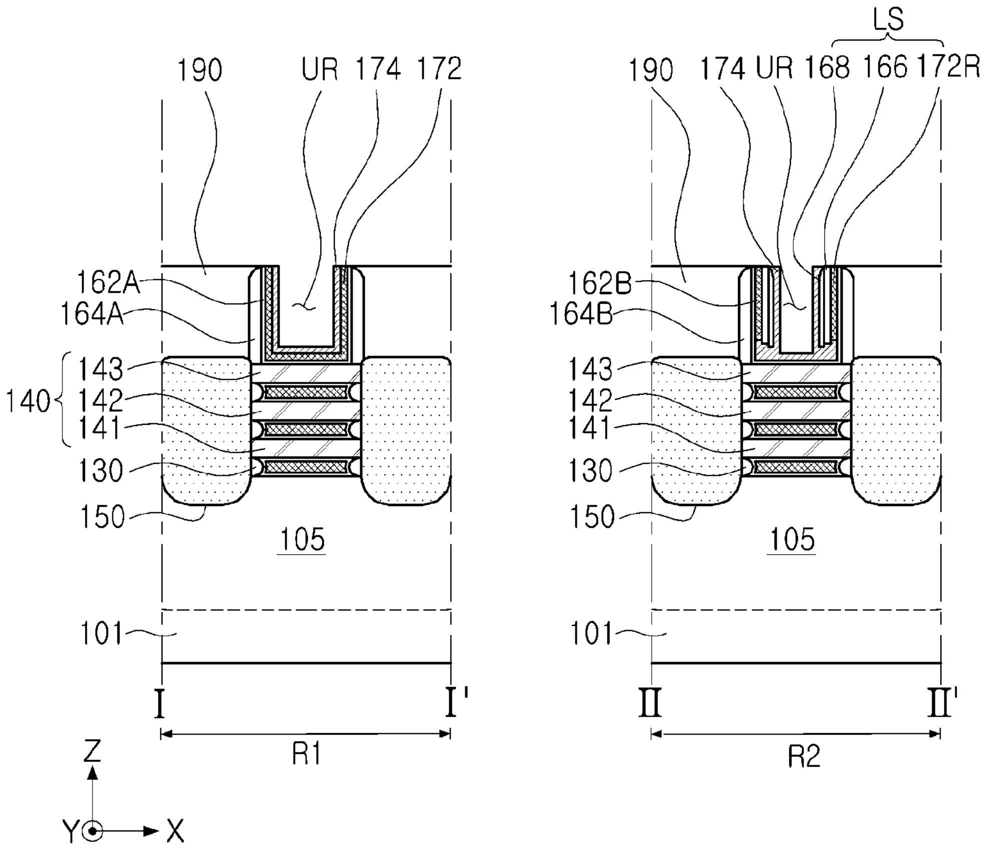
Figure 21B:
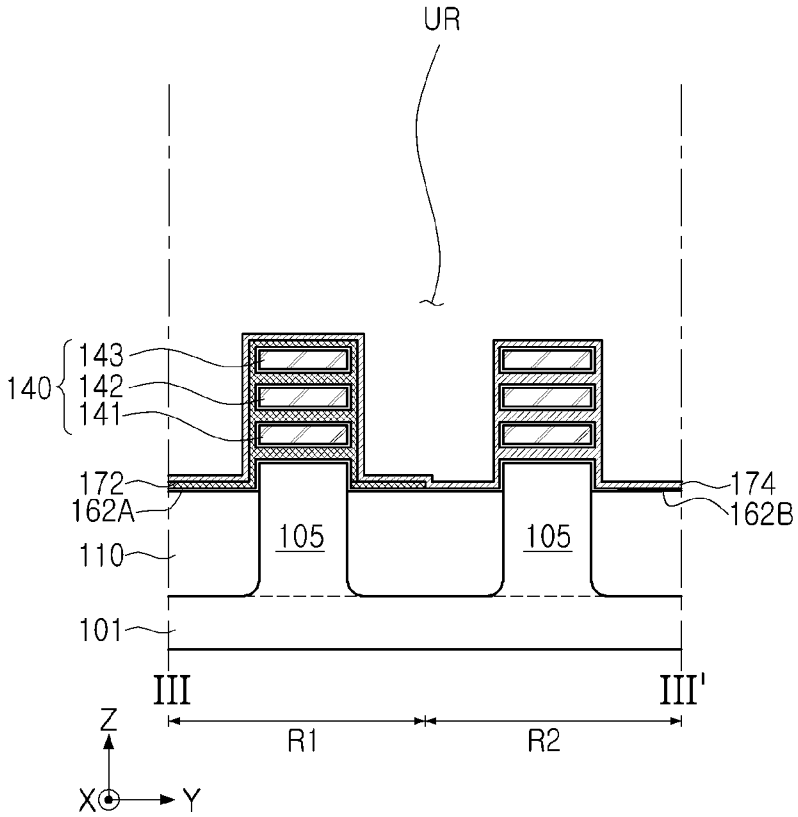

Referring to FIGS. 9B, 21A, and 21B, after the mask layer ML is removed from the first region R1 (S167) and the etching protection layer 166 is removed, a second electrode layer 174 may be formed in the first and second regions R1 and R2 (S168).

First, the mask layer ML may be removed from the first region R1, and the exposed etching protection layer 166 may be removed. When the mask layer ML is removed, the lateral protection layer 168 on the side surface of the mask layer ML may also be removed. Thereafter, the second electrode layer 174 may be formed in the entire regions. Accordingly, the second electrode layer 174 may be formed on the second gate dielectric layers 162B in the second region R2 and on the first gate dielectric layers 162A in the first region R1. In the cross-sectional view in the X-direction, in the upper gap region UR of the second region R2, the second electrode layer 174 may be formed to cover internal side surfaces and lower surfaces of the lateral structure LS.

Figure 22A:
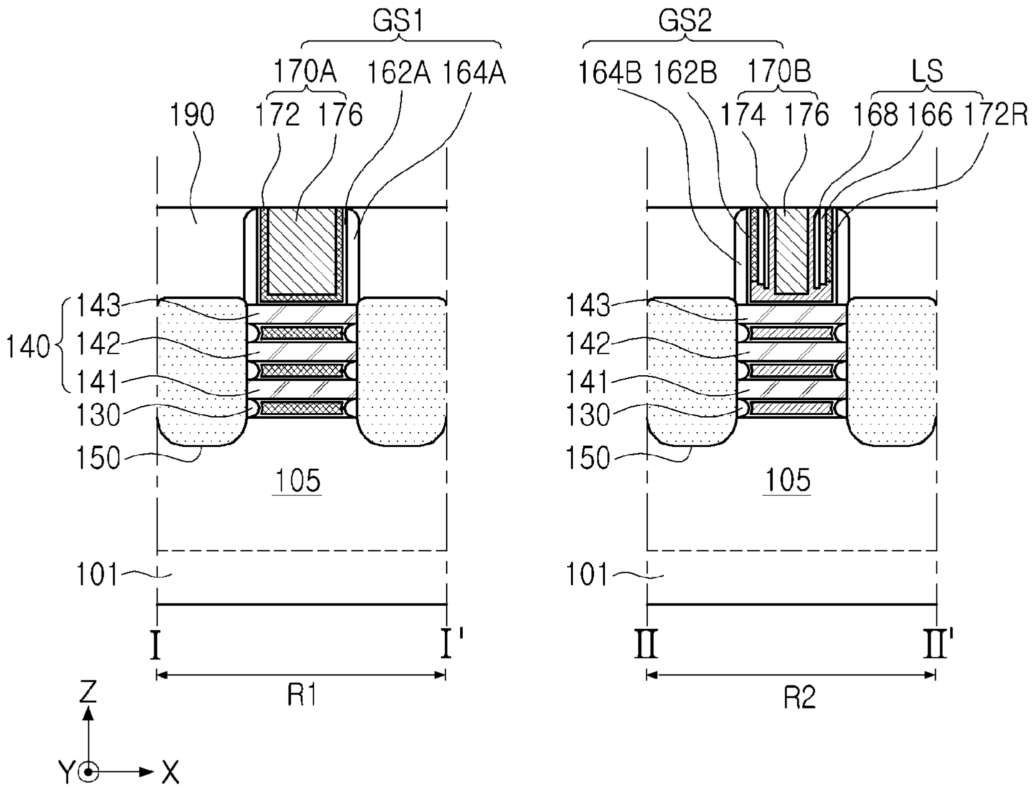
Figure 22B:
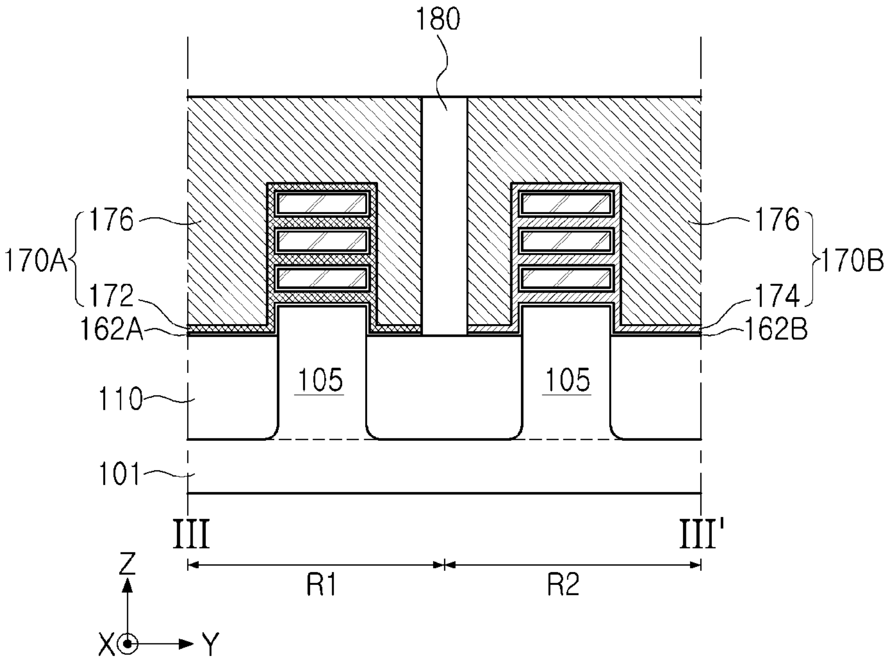

Referring to FIGS. 9A, 22A, and 22B, by forming a third electrode layer 176 in the first and second regions R1 and R2, the first and second gate electrodes 170A and 170B and the first and second gate structures GS1 and GS2 including the first and second gate electrodes 170A and 170B may be formed (S160).

First, a process of removing the second electrode layer 174 from the first region R1 may be performed. A specific process of removing the second electrode layer 174 is not limited to any particular method. For example, in the example embodiment in FIGS. 7A and 7B, the mask layer ML and the lateral protection layer 168 may be formed in the first region R1 in the same manner as described in the aforementioned example embodiment with reference to FIGS. 15A to 20B, and the second electrode layer 174 may be removed. The process of removing the second electrode layer 174 from the first region R1 may be performed similarly to the process of removing the first electrode layer 172 from the second region R2. In this case, the lateral structure LSe may also be formed in the first region R1 as shown in FIGS. 7A and 7B, for example.

Thereafter, a third electrode layer 176 may be formed in the first and second regions R1 and R2. In the first region R1, the third electrode layer 176 may be formed on the first electrode layer 172 in the upper gap region UR and may be formed to entirely fill the upper gap region UR. In the second region R2, the third electrode layer 176 may be formed on the second electrode layer 174 in the upper gap region UR and may be formed to entirely fill the upper gap region UR. Thereafter, a planarization process may be performed. Accordingly, the first and second gate electrodes 170A and 170B and the first and second gate structures GS1 and GS2 including the first and second gate electrodes 170A and 170B may be formed.

In some example embodiments, the third electrode layer 176 may include or may be formed of a plurality of conductive layers. The shape of the upper portion of the lateral structure LS may change depending on the thickness of the upper portions of the first and second gate electrodes 170A and 170B removed during the planarization process. For example, when the thicknesses of the first and second gate electrodes 170A and 170B and the lateral structure LS, removed during the planarization process, are relatively large, the lateral protection layer 168 of the lateral structure LS may have a planar upper surface.

Thereafter, a gate isolation layer 180 may be formed. The gate isolation layer 180 may be formed by forming an opening penetrating the first and second gate electrodes 170A and 170B and the first and second gate dielectric layers 162A and 162B from the upper portion and filling the opening with an insulating material on a boundary between the first region R1 and the second region R2.

Thereafter, referring to FIGS. 2A and 2B together, contact plugs 195 may be formed (S170).

First, an interlayer insulating layer 190 may be further formed on the first and second gate structures GS1 and GS2. Thereafter, contact plugs 195 exposing the source/drain regions 150 may be formed by patterning the interlayer insulating layer 190. Contact plugs 195 may be formed by filling the contact holes with a conductive material. Specifically, a material forming a barrier layer may be deposited in the contact holes, and a metal-semiconductor compound layer such as a silicide layer may be formed on a lower end by performing a silicide process. Thereafter, a conductive material may be deposited to fill the contact holes, thereby forming the contact plugs 195. Accordingly, the semiconductor device 100 in FIGS. 1 to 3 may be manufactured.

According to the aforementioned example embodiments, using a lateral protection layer protecting the side surface of the mask layer, a semiconductor device having improved electrical properties and reliability may be provided.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:

a substrate having a first region in which a first active region is disposed and a second region in which a second active region is disposed, wherein each of the first active region and the second active region extends in a first direction;

a first gate structure disposed at the first region, wherein the first gate structure extends in a second direction different from the first direction and intersects the first active region, and wherein the first gate structure includes a first gate dielectric layer, a first electrode layer, and a second electrode layer stacked in order;

a second gate structure disposed at the second region, wherein the second gate structure extends in the second direction and intersects the second active region, and wherein the second gate structure includes a second gate dielectric layer, a third electrode layer, and a fourth electrode layer stacked in order;

a plurality of first channel layers being spaced apart from each other in a third direction perpendicular to an upper surface of the first active region, wherein each of the plurality of first channel layers is surrounded by the first gate structure;

a plurality of second channel layers being spaced apart from each other in the third direction on the second active region, wherein each of the plurality of second channel layers is surrounded by the second gate structure;

a pair of first source/drain regions disposed in first recessed regions adjacent to opposite sides of the first gate structure, and connected to the plurality of first channel layers;

a pair of second source/drain regions disposed in second recessed regions adjacent to opposite sides of the second gate structure, and connected to the plurality of second channel layers;

a pair of first gate spacer layers covering opposite side surfaces of the first gate structure;

a pair of second gate spacer layers covering opposite side surfaces of the second gate structure; and a lateral structure disposed on each of internal side walls of the pair of second gate spacer layers, wherein the lateral structure is interposed between the second gate dielectric layer and the third electrode layer, wherein a protrusion portion of the third electrode layer extends horizontally to a region below the lateral structure and contacts a lowermost surface of the lateral structure, wherein a portion of the second gate dielectric layer is disposed in a space between a lower surface of the protrusion portion and an upper surface of a topmost second channel layer of the plurality of second channel layers, and wherein the protrusion portion is disposed in a space between the portion of the second gate dielectric layer and the lower surface of the lateral structure.

2. The semiconductor device of claim 1, wherein the lowermost surface of the lateral structure is disposed at a level higher than a level of lower surfaces of the pair of second gate spacer layers.

3. The semiconductor device of claim 1, wherein the lateral structure includes a plurality of lateral structures spaced apart from each other in the first direction, and wherein the plurality of lateral structures are disposed on internal side surfaces of the second gate dielectric layer, respectively.

4. The semiconductor device of claim 1, wherein the lateral structure extends in the second direction along the second gate structure.

5. The semiconductor device of claim 1, wherein the lateral structure includes a lateral protection layer that is formed of an insulating material.

6. The semiconductor device of claim 5, wherein the lateral protection layer includes a material that is different from a material of the second gate dielectric layer and is different from a material of the pair of second gate spacer layers.

7. The semiconductor device of claim 5, wherein the lateral protection layer includes titanium.

8. The semiconductor device of claim 1, wherein the lateral structure includes a lateral conductive layer, an etching protection layer, and a lateral protection layer disposed in order from an internal side surface of the second gate dielectric layer, and wherein at least one of the etching protection layer and the lateral protection layer is an insulating layer.

9. The semiconductor device of claim 8, wherein the lateral conductive layer includes a same material as a material of the first electrode layer.

10. The semiconductor device of claim 8, wherein the second gate dielectric layer is in contact with the third electrode layer and the lateral conductive layer on the plurality of second channel layers.

11. The semiconductor device of claim 1, further comprising:

a gate isolation layer disposed between the first gate structure and the second gate structure in the second direction, wherein the first gate structure and the second gate structure extend along a straight line extending in the second direction.

12. The semiconductor device of claim 11, wherein a first end of the lateral structure contacts the gate isolation layer.

13. The semiconductor device of claim 1, wherein the pair of first source/drain regions include impurities having a first type of conductivity, and wherein the pair of second source/drain regions include impurities having a second type of conductivity.

14. The semiconductor device of claim 1, further comprising:

a plurality of internal spacer layers disposed between at least one of the first gate structure and the second gate structure, and a corresponding pair of the pair of first source/drain regions and the pair of second source/drain regions.

15. A semiconductor device, comprising:

a substrate including an active region extending in a first direction;

a gate structure extending in a second direction intersecting the active region on the substrate and including a gate dielectric layer and a gate electrode;

a plurality of channel layers spaced apart from each other in a third direction perpendicular to an upper surface of the substrate on the active region, each channel layer of the plurality of channel layers being surrounded by the gate structure;

a lateral structure disposed on an internal side surface of the gate dielectric layer and contacting the gate dielectric layer and the gate electrode; and a pair of source/drain regions on opposite sides of the gate structure, and connected to the plurality of channel layers, wherein a level of a lowermost surface of the lateral structure is higher than a level of a lowermost surface of the gate electrode.

16. The semiconductor device of claim 15, wherein the lateral structure is disposed above an uppermost channel layer among the plurality of channel layers.

17. The semiconductor device of claim 15, further comprising:

a pair of gate spacer layers covering the opposite sides of the gate structure, wherein the lateral structure has a first length in the third direction, and the pair of gate spacer layers have a second length longer than the first length in the third direction.

18. The semiconductor device of claim 17, wherein the lowermost surface of the lateral structure is disposed at a level higher than a level of lower surfaces of the pair of gate spacer layers.

19. A semiconductor device, comprising:

a substrate having a first region in which a first active region is disposed and a second region in which a second active region is disposed, wherein each of the first active region and the second active region extends in a first direction;

a first gate structure disposed at the first region, wherein the first gate structure extends in a second direction and intersects the first active region, and wherein the first gate structure includes a first gate dielectric layer and a first electrode;

a second gate structure disposed at the second region, wherein the second gate structure extends in the second direction and intersects the second active region, and wherein the second gate structure includes a second gate dielectric layer and a second electrode;

a plurality of first channel layers spaced apart from each other in a third direction perpendicular to an upper surface of the first active region, wherein each of the plurality of first channel layers is surrounded by the first gate structure;

a plurality of second channel layers spaced apart from each other in the third direction on the second active region, wherein each of the plurality of second channel layers is surrounded by the second gate structure;

a pair of first gate spacer layers covering opposite side surfaces of the first gate structure;

a pair of second gate spacer layers covering opposite side surfaces of the second gate structure; and a lateral structure disposed in the second gate structure and including an insulating layer, wherein the first electrode has a first length, and wherein the second electrode has a second length smaller than the first length.

20. The semiconductor device of claim 19, wherein a first side surface of the lateral structure contacts the second gate dielectric layer, and wherein a second side surface and a lower surface of the lateral structure contacts the second electrode.

* * * * *